(12) United States Patent
Wagenleitner et al.

(10) Patent No.: US 10,954,122 B2
(45) Date of Patent: Mar. 23, 2021

(54) METHOD FOR BONDING OF AT LEAST THREE SUBSTRATES

(71) Applicant: EV Group E. Thallner GmbH, St. Florian am Inn (AT)

(72) Inventors: Thomas Wagenleitner, Aurolzmunster (AT); Thomas Glinsner, St. Florian am Inn (AT); Harald Zaglmayr, Vocklabruck (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/487,147

(22) PCT Filed: Mar. 16, 2017

(86) PCT No.: PCT/EP2017/056301
§ 371 (c)(1),
(2) Date: Aug. 20, 2019

(87) PCT Pub. No.: WO2018/166605
PCT Pub. Date: Sep. 20, 2018

(65) Prior Publication Data
US 2020/0055729 A1    Feb. 20, 2020

(51) Int. Cl.
*H01L 21/67*    (2006.01)
*B81C 1/00*    (2006.01)
(Continued)

(52) U.S. Cl.
CPC .... *B81C 1/00357* (2013.01); *H01L 21/67092* (2013.01); *H01L 21/681* (2013.01); *H01L 23/544* (2013.01); *H01L 2224/75753* (2013.01)

(58) Field of Classification Search
CPC .............. B81C 1/00357; H01L 23/544; H01L 21/67092; H01L 2224/75753; H01L 21/68–682
See application file for complete search history.

(56) References Cited

U.S. PATENT DOCUMENTS 6,214,692 B1    4/2001 Thallner
9,662,846 B2    5/2017 Kast et al.
(Continued)

FOREIGN PATENT DOCUMENTS

TW    201231259 A1    8/2012
WO    WO 2011/019881 A1    2/2011
(Continued)

OTHER PUBLICATIONS

International Search Report from corresponding International Patent Application No. PCT/EP2017/056301, dated Nov. 13, 2017.

*Primary Examiner* — Selim U Ahmed
*Assistant Examiner* — Evan G Clinton
(74) *Attorney, Agent, or Firm* — Kusner & Jaffe

(57) ABSTRACT

A method for bonding at least three substrates to form a substrate stack, wherein the substrate stack has at least one lowermost substrate a middle substrate, and an upper substrate. The method includes the following steps: aligning the middle substrate to the lowermost substrate and bonding the middle substrate to the lowermost substrate, then aligning the upper substrate and bonding the upper substrate to the middle substrate, wherein the upper substrate is aligned to the lowermost substrate.

13 Claims, 13 Drawing Sheets

(51) Int. Cl.
*H01L 21/68* (2006.01)
*H01L 23/544* (2006.01)

(56) References Cited

U.S. PATENT DOCUMENTS

| | | | |
|---|---|---|---|
| 2012/0031557 A1* | 2/2012 | Kinouchi | B81C 1/00357 |
| | | | 156/324.4 |
| 2012/0152433 A1 | 6/2012 | Oganesian et al. | |
| 2015/0044786 A1 | 2/2015 | Huang et al. | |
| 2016/0148826 A1 | 5/2016 | Thallner | |
| 2016/0240420 A1* | 8/2016 | Wagenleitner | H01L 21/6838 |
| 2017/0309605 A1* | 10/2017 | Rudmann | H01L 27/14618 |
| 2020/0124774 A1* | 4/2020 | Hoshi | H04N 5/2254 |

FOREIGN PATENT DOCUMENTS

| | | |
|---|---|---|
| WO | WO 2012/079597 A1 | 6/2012 |
| WO | WO 2012/083978 A1 | 6/2012 |
| WO | WO 2013/023708 A1 | 2/2013 |
| WO | WO 2013/091714 A1 | 6/2013 |
| WO | WO 2014/191033 A1 | 12/2014 |
| WO | WO 2014/202106 A1 | 12/2014 |
| WO | WO 2015/082020 A1 | 6/2015 |
| WO | WO 2015/113641 A1 | 8/2015 |
| WO | WO 2017/162272 A1 | 9/2017 |

\* cited by examiner

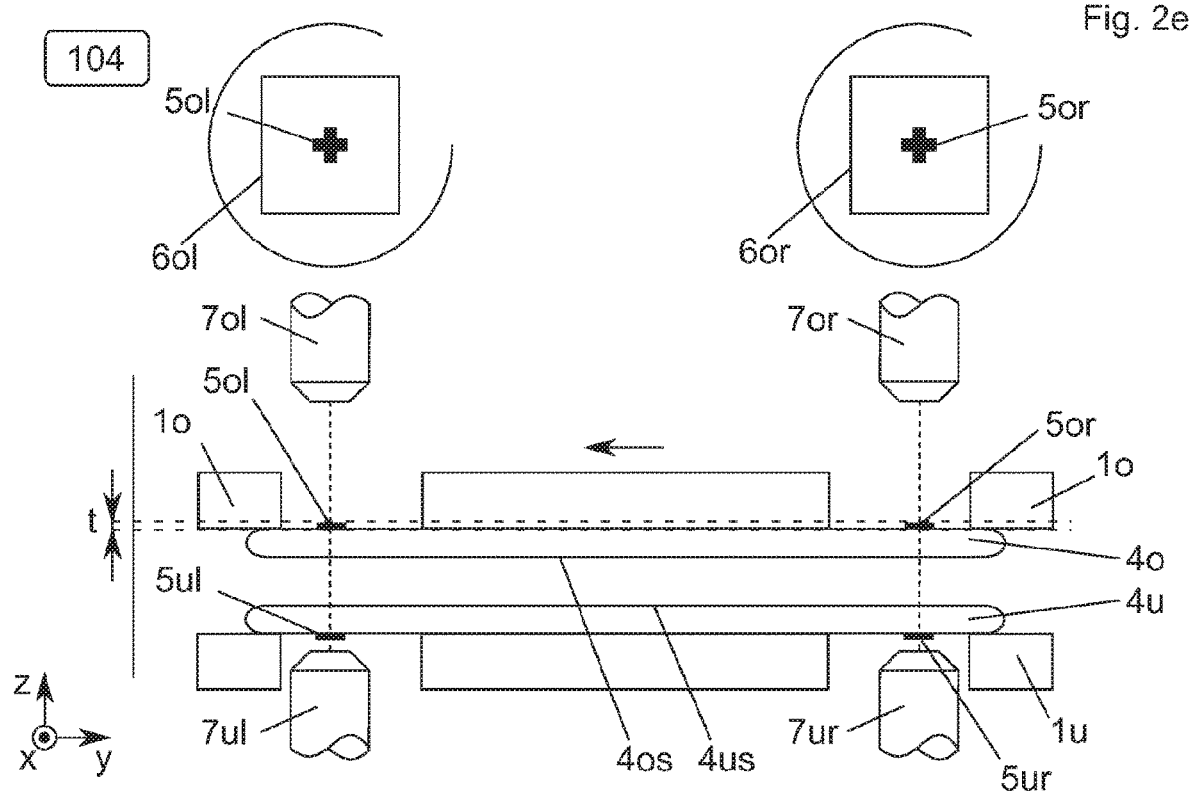
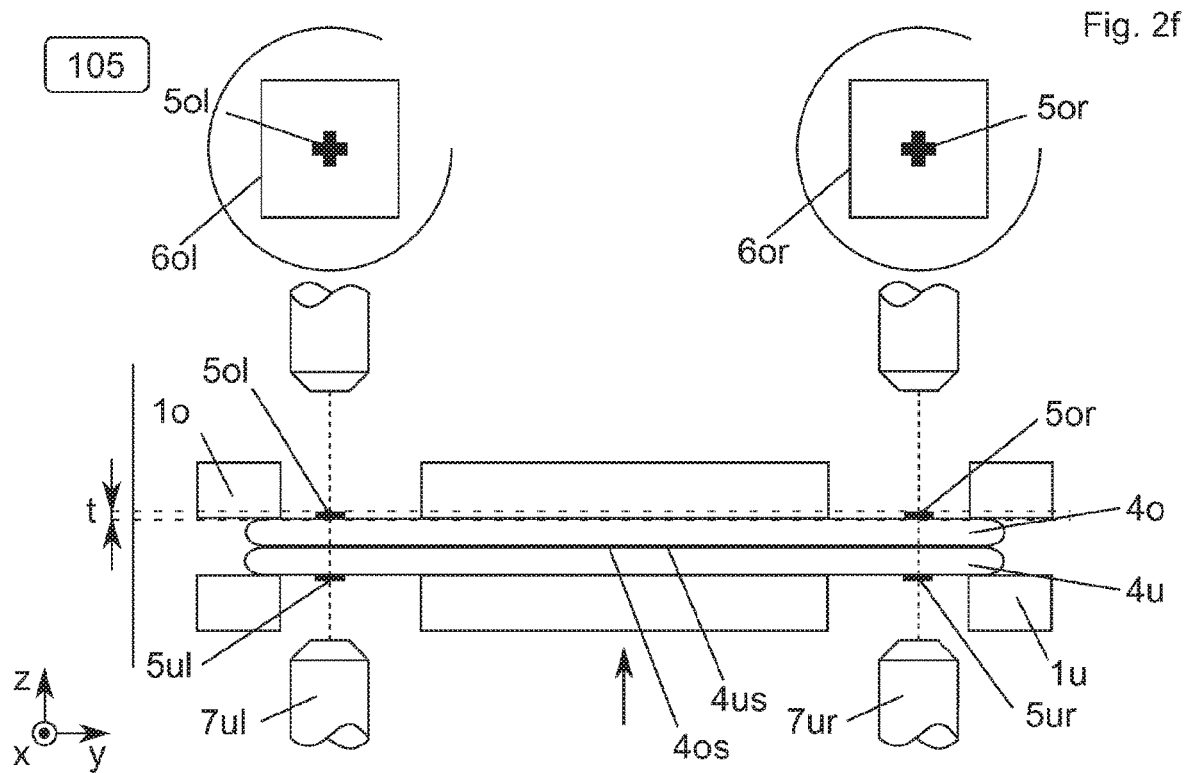

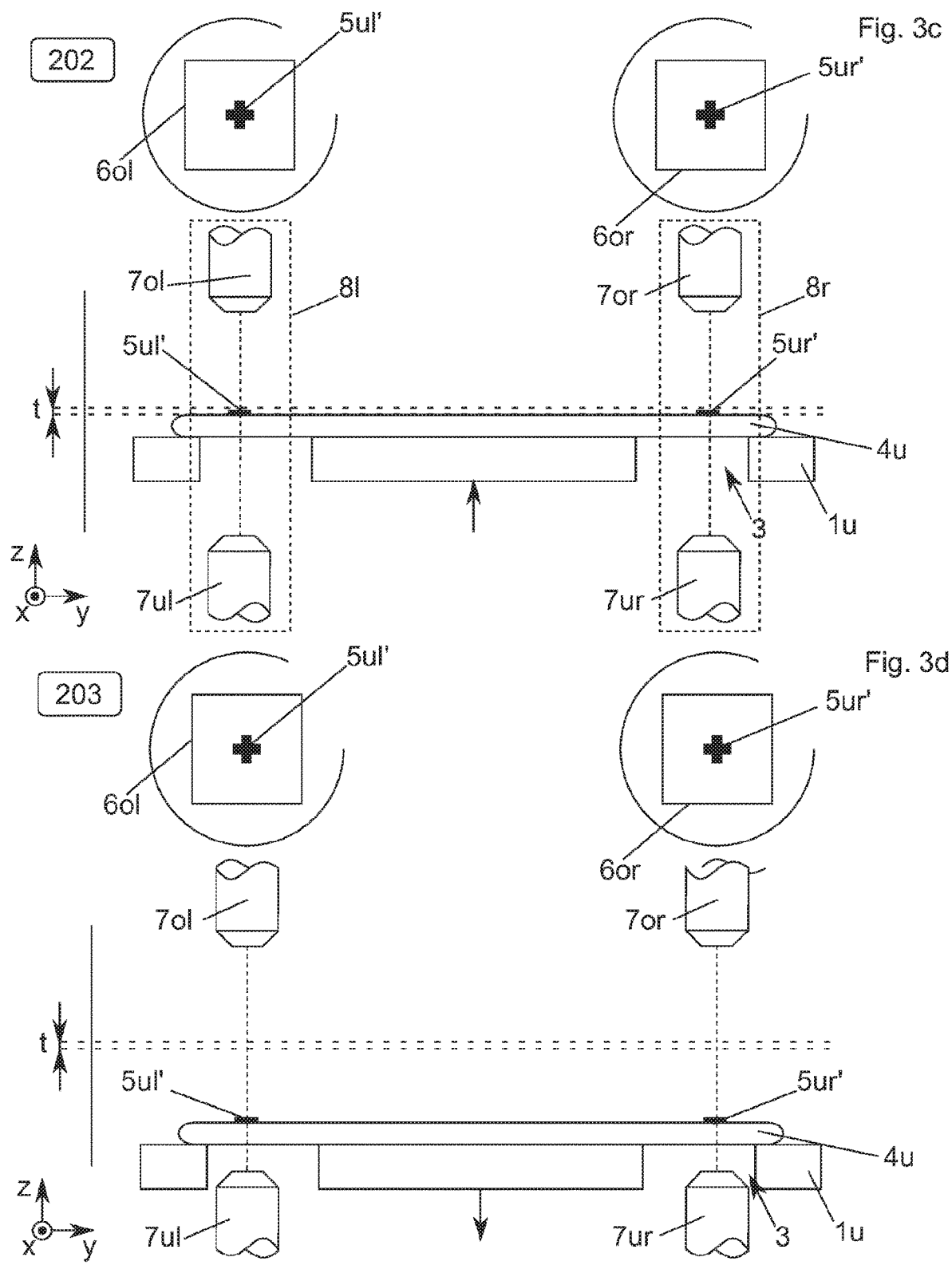

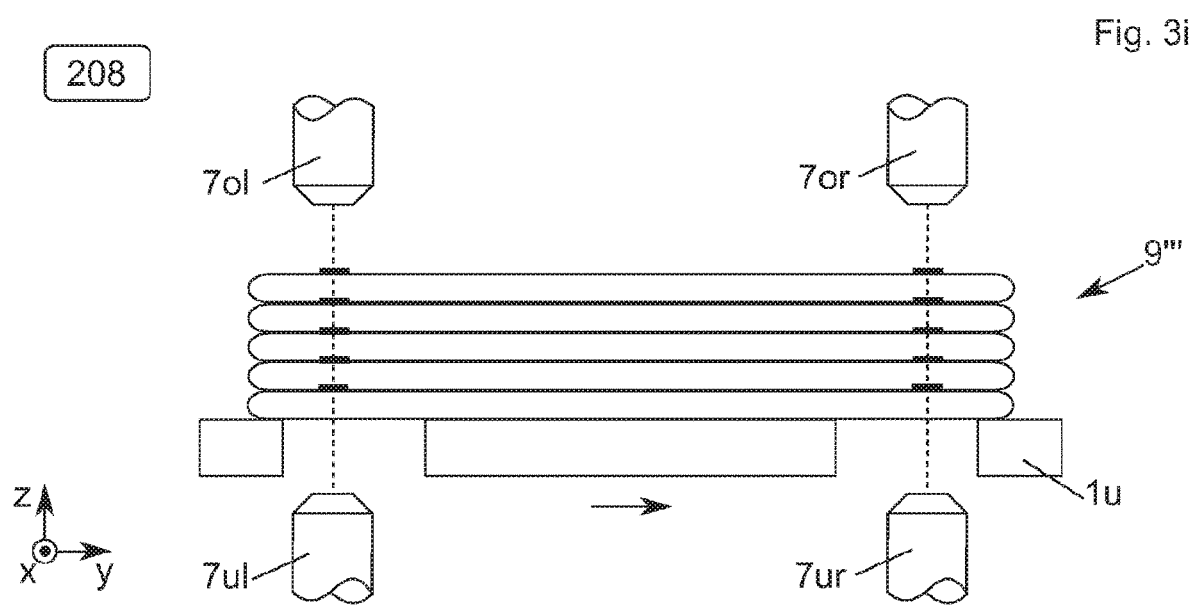

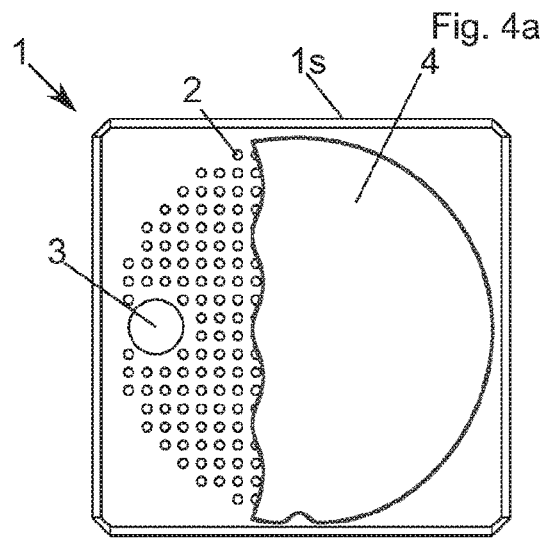
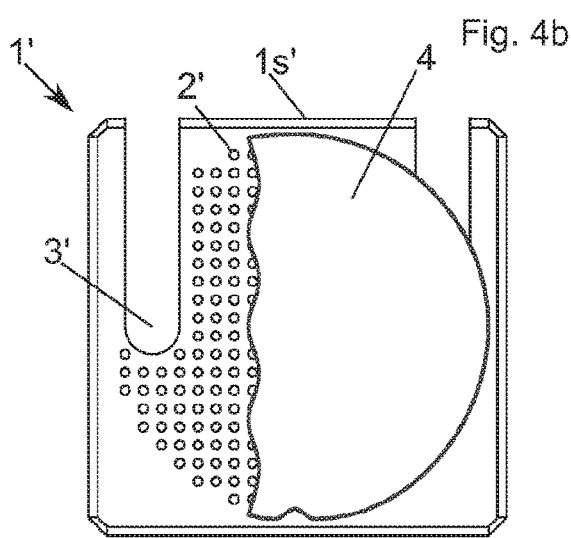
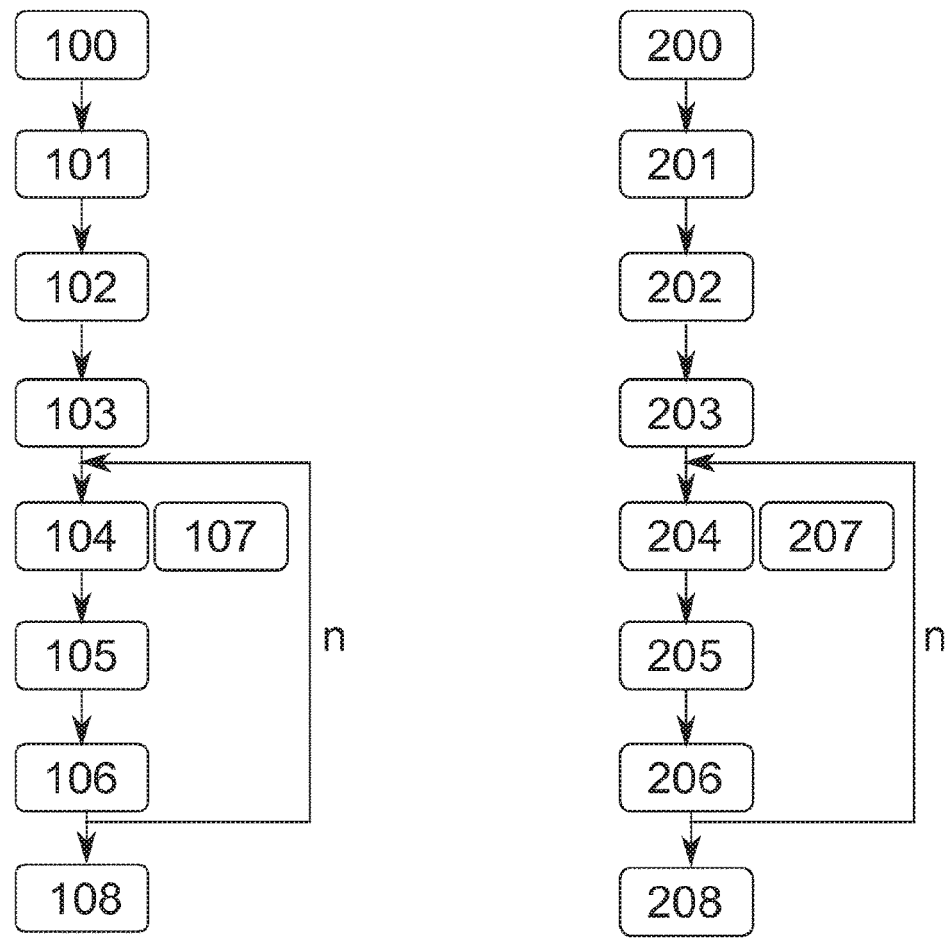

METHOD FOR BONDING OF AT LEAST THREE SUBSTRATES

FIELD OF THE INVENTION

The present invention relates generally to substrate bonding, and more particularly to a method for bonding at least three substrates.

BACKGROUND OF THE INVENTION

In the micro-optics field, efforts have been made for some years to stack a plurality of optical elements on top of one another in the millimeter or micrometer scale. By stacking a plurality of different optical elements, it becomes possible to construct highly complicated optical systems in the millimeter or micrometer scale respectively. These highly complicated optical systems can thus be accommodated in smartphones, tablets and other electronic devices. Due to the steadily advancing miniaturization, the optical systems also need to become correspondingly smaller. To keep up with the rapidly advancing miniaturization, processes need to be created, which, on the one hand, allow for the mass production of such products, but which, on the other hand, also improve the precision, with which the individual optical elements are aligned with one another.

In the prior art, the optical elements are produced on a substrate, in particular a wafer. Several hundreds to thousands of such optical elements are located on a wafer. The optical elements were manufactured on the substrate with extremely high precision. To obtain a highly complex optical system of a plurality of, in particular different, optical elements, which are stacked on top of one another, a plurality of such substrates, generally with different, optical elements, are connected to one another. This connection process is called bonding. Prior to the connection, it is essential that the two substrates, which are to be connected to one another, need to be aligned relative to one another with a very high precision. This obtained high alignment accuracy must also be maintained while the two substrates approach one another.

The largest problem in the prior art is that substrate stacks are constructed with today's methods in such a way that the n+1 substrate is always aligned to the n-th substrate. Due to the connection of the n-1-th substrate to the n-th substrate, an error propagation of the alignment occurs beyond the substrate stack. This shall be explained using the following example: If the second substrate was aligned and bonded relative to the first substrate with an, albeit slight, error, the error of the third substrate to the first substrate will generally be even larger. In the case of such a stack sequence, one can also not rely on the fact that the errors will cancel each other out statistically, as the number of substrates in the stack increases, because the number of the substrates in the stack is too small for this. Every error in the alignment between two substrates furthermore has a direct impact on the optical path of the entire, highly complex, optical system. If, in the subsequent use, a light cone passes through the highly complex optical system, a corresponding error in the positioning of two optical elements can irrevocably interfere with a light cone and can thus adversely affect the entire optical imaging.

SUMMARY OF THE INVENTION

It is an object of the present invention to provide a method and a substrate holder, by means of which the disadvantages of the prior art can be eliminated and the alignment errors in response to the bonding of the substrates can be minimized, and highly complex optical systems can be produced with slight deviations.

This object is solved by means of the subject matter of the independent patent claims.

Advantageous further developments of the invention are specified in the subclaims. All combinations of at least two features, which are specified in the description, in the claims and/or the drawings, also fall within the scope of the invention. In the case of specified value ranges, values within the mentioned boundaries shall also be considered as being disclosed as threshold values and shall be capable of being claimed in any combination. If individual or a plurality of method steps can be carried out on different devices or modules, they will in each case be disclosed separately as independent method.

Hereinafter, the directions X and Y refer to directions in the substrate plane, which are perpendicular to one another. The Z direction is arranged perpendicular to the substrate plane or to the directions X and Y, respectively, thus resulting in a Cartesian coordinate system.

In the further course of the publication, the method according to the invention will be described in an exemplary manner using the alignment of substrates with optical elements, in particular lenses. It is clear to the person of skill in the art in the field that the method according to the invention is not limited to the alignment of substrates with optical elements, but is suitable and can be used for the alignment of any substrates in a substrate stack. In particular, the method can for example also be used for the alignment of a plurality of substrates with TSVs (though-silicon-vias). In particular substrate stacks with TSV connections between the substrates are becoming increasingly important due to the advancing 3D technology of electronic components. Above all, such TSV substrates are of fundamental importance for the production of memories.

According to the invention, provision is made for a method for bonding at least three substrates with optical lenses to form a substrate stack, so that the lenses are arranged on top of one another, wherein the substrate stack has at least one lowermost substrate, a middle substrate, and an upper substrate, comprising the following steps:
  aligning the middle substrate to the lowermost substrate and bonding the middle substrate to the lowermost substrate,
  then aligning the upper substrate and bonding the upper substrate to the middle substrate, characterized in that the upper substrate is aligned to the lowermost substrate.

In a preferred embodiment, provision is made for optical axes of the lenses, which are arranged on top of one another, to be aligned approximately congruently. The distance between the optical axes is in particular less than 1 μm, preferably less than 500 nm, even more preferably less than 50 nm, most preferably less than 10 nm, most preferably of all less than 5 nm. It can thus be attained in an advantageous manner that an optimal arrangement of the optical elements is possible. In the following, congruent will also be identified with collinear. The collinearity is to thereby not interpreted in a mathematically strict manner. In reality, a complete collinearity will never be reached. Collinearity is to in particular be understood such that the angle between the optical axes is smaller than 5°, preferably smaller than 1.0°, more preferably smaller than 0.5°, most preferably smaller than 0.1°, most preferably of all smaller than 0.05°.

According to another preferred embodiment, provision is made for the upper substrate to be aligned to the alignment marks of the lowermost substrate. The alignment marks can be arranged on the upper and/or lower side of the lowermost substrate.

According to another preferred embodiment, provision is made for each subsequent substrate to be aligned to the lowermost substrate. It is thus possible in an advantageous manner to minimize the alignment error for the most part in the case of the subsequent substrates.

According to another preferred embodiment, provision is made for each substrate to have a plurality of optical lenses. It is thus possible in an advantageous manner to be able to create a plurality of lenses, which are stacked on top of one another.

According to another preferred embodiment, provision is made for each substrate to have a plurality of TSVs. It is thus possible in an advantageous manner to be able to create a plurality of substrates, which are stacked on top of one another and the functional units of which are connected to one another via TSVs.

According to another preferred embodiment, provision is made for at least three substrates to be bonded to one another, preferably at least five substrates, more preferably at least 10 substrates, even more preferably at least 15 substrates. Complex optical systems can thus be produced in an advantageous manner.

According to another preferred embodiment, the method according to the invention has the following sequence:
- arranging and fixing the lowermost substrate to a lower substrate holder,
- detecting alignments marks on the lowermost substrate in fields of view of lenses,
- arranging and fixing the middle substrate on an upper substrate holder,
- detecting alignment marks on the middle substrate by means of the lenses,
- aligning the middle substrate to the lowermost substrate,
- bonding the middle substrate to the lowermost substrate, wherein the bonded substrates remain on the lower substrate holder,
- arranging and fixing the upper substrate on the upper substrate holder,
- detecting alignment marks on the upper substrate by means of the lenses,
- aligning the upper substrate to the lowermost substrate,
- bonding the upper substrate to the middle substrate to produce substrate stack.

According to another preferred embodiment, provision is made for the alignment marks to be detected by lenses, which are arranged below the lowermost substrate, through recesses in the lower substrate holder. It may be necessary to lift the substrate holder over the lenses, so that the lenses are positioned in the recesses.

According to another preferred embodiment, provision is made for the recesses to be embodied as continuous holes in the lower substrate holder. Advantageously, the lenses can be arranged in the continuous holes in a particularly efficient manner.

According to another preferred embodiment, provision is made for the recesses to be embodied as elongated holes in the lower substrate holder. Advantageously, the lower substrate holder can be moved in a particularly efficient manner across the lower lenses in the elongated holes.

According to another preferred embodiment, provision is made for the lower substrate holder to be capable of being moved in such a way that the lower lenses are arranged inside recesses.

According to another preferred embodiment, provision is made for the lower substrate holder to be moved in the Z direction by means of a Z-positioning unit in such a precise manner that a deviation in an X and Y direction is minimal. Advantageously, the lower substrate holder can thus be moved in a highly precise manner for bonding purposes.

According to another preferred embodiment, provision is made for a readjusting unit to correct a deviation of the lower substrate holder in the X and/or Y direction in response to a movement in the Z direction. The lower substrate holder can thus advantageously be moved in a highly precise manner for bonding purposes.

According to another embodiment, provision is made for the lower substrate holder to be moved completely out of the process region, in order to be brought into its initial position again at a later process step. In this case, it may in particular be necessary to lift the substrate holder over the lenses. The lower sample holder is then moved into its position again prior to the bonding step. A highly exact positioning in the x, y and z direction is necessary for this purpose.

Another subject matter of the invention at hand relates to a substrate holder, wherein the substrate holder has recesses for accommodating lenses and fixing elements, preferably vacuum openings, for fixing a substrate.

The basic idea and core of the invention is to align the newly added substrate to the alignment marks of the lowermost substrate. It is in particular significant thereby that the motors for the movement in the z direction of the substrate holder, on which the substrate stack is constructed, operate in a highly precise manner.

It is the advantage of the invention that a substrate stack, and thus a plurality of highly complex, optical systems, can be aligned to one another and bonded with a minimal error. The waste is thus reduced, and the imaging characteristics of the individual highly complex optical systems is improved significantly.

The z-positioning unit must only have a negligible play in the x and/or y direction, or a correction system must be used, which ensures that the substrate holder, which moves in the z direction, is readjusted. The correction system can in particular be a control loop between the X and Y motors on the one hand, and detectors on the other hand. During the z-positioning, the detectors continuously measure the X and/or Y position of the substrate holder and forward corresponding changes to adjusting elements, in particular motors, more preferably piezo-elements, which make the readjustment. The detectors are in particular lenses, which measure alignment marks on the lower side of the substrate holder, or laser interferometers, which measure the relative change in position of the side walls of the substrate holder. The person of skill in the art is very familiar with such optical measuring systems.

Substrate Holder

The substrate holder has fixations. The fixations serve the purpose of holding the substrates. The fixations can be:
1. mechanical fixations, in particular
   a. clamps
2. vacuum fixations, in particular comprising
   a. individually controllable vacuum paths
   b. vacuum paths, which are connected to one another
3. electrical fixations, in particular
   a. electrostatic fixations 4. magnetic fixations
5. adhesive fixations, in particular
   a. gel pack fixations
   b. fixations comprising adhesive, in particular controllable surfaces The fixations can in particular be controlled electronically. The vacuum fixation is the preferred type of fixation. The vacuum fixation preferably is comprised of a plurality of vacuum paths, which escape at the surface of the substrate holder. The vacuum paths can preferably be controlled individually. In a technically more realizable application, some vacuum paths are combined to form vacuum paths segments, which can be controlled individually, thus evacuated or flooded. Every vacuum segment, however, is independent of the other vacuum segments. The option of constructing individually controllable vacuum segments is thus obtained. The vacuum segments are preferably constructed in an annular manner. A specific, radially-symmetrical fixation, which is in particular guided from the inside to the outside, and/or detachment of a substrate from the substrate holder, is thus made possible.

In an exemplary embodiment of the substrate holder according to the invention, the recesses are holes, which are closed across their entire circumference.

In another embodiment of the substrate holder according to the invention, the recesses are open towards an edge of the substrate holder and are in particular produced by means of a simple milling process.

In addition to the fixing means, the substrate holder can also have means for actively mechanically influencing, in particular straining, more preferably local straining, of the substrates. Preferably a local influencing of the horizontal and/or vertical straining of the substrate is made possible with such means, so that local strains and/or stresses can be changed, in particular minimized. Such means were disclosed in detail in publication WO2012083978 A1.

The substrate holders from the publications WO2012083978A1, PCT/EP2016/056249, WO2013023708A1, WO2014191033A1, WO2015113641A1, WO2012079597A1 can be used for example, but not exclusively.

Systems

In an embodiment according to the invention, an aligner is comprised of at least one lower substrate holder, an upper substrate holder, two detection units each comprising two lenses, and preferably one position error correction device (PEC). The accuracy, with which the position detection of the sample holders is carried out by means of the position error correction device, is better than 1 μm, preferably better than 500 nm, more preferably better than 100 nm, most preferably better than 50 nm, most preferably of all better than 10 nm. The position error correction device is in particular significant, when one of the two substrate holders, in particular the lower substrate holder, leaves the process region completely and needs to be moved into the process region again in a further process step. The use of a position error correction device ensures a highly accurate, renewed positioning of the substrate holder, without renewed measuring of the alignment marks.

The lower substrate holder in particular has recesses, through which the lower lenses can be guided to the bond interface or lower alignment marks, respectively, on the lower side of the lowermost substrate. The lower substrate holder can preferably be shifted in the x and/or y and/or z direction. A further publication and in particular the figures in particular describe and show embodiments, in the case of which a substrate holder, in particular the lower substrate holder, is moved only in the z direction after a first positioning in the x and y direction. It is also conceivable, however, that the substrate holder leaves the process region completely, so as to move into the process region again at a later point in time. In response to each new entrance of the substrate holder into the process region, a new calibration of the substrate can in particular be carried out by the lenses on the substrate holder. The substrate holder, however, is preferably brought into its original position only by means of a position error correction device. In the case of a substrate holder, which must leave the entire process region, it may be necessary to lift the substrate holder over the lenses, which were sunk into the recesses thereof.

The upper substrate holder in particular has recesses, through which the upper lenses can be guided to the bond interface or upper alignment marks, respectively, on the upper side of the upper substrate. The upper substrate holder, however, is preferably constructed in such a way that it does not have any recesses.

The upper substrate holder can preferably be shifted in the x and/or y and/or z direction. The upper substrate holder, however, can preferably only be shifted in one direction, so that motors for the further two directions can be forgone. In particular a highly accurate guidance of the upper substrate holder in one direction is thus made possible.

Such aligners are described in detail in the publications U.S. Pat. No. 6,214,692B1, WO2014202106A1 and WO2015082020A1.

Processes

In the further course of the publication, outer side identifies all surfaces, which point in the direction of the lenses. In the further course of the publication, inner sides identifies all surfaces, which point in the direction of the bond interfaces.

In all following processes, exemplary embodiments will be described and illustrated, in which the lower substrate holder performs only a relative movement in the z direction relative to the upper substrate holder, after an initial positioning in the x and/or y direction. Instead of this preferred approach, the substrate holder can also be moved out of the process region completely and can be returned back into the process region in a highly precise manner. In particular, a new calibration of the first substrate of the substrate stack on the substrate holder is disclosed as option for ensuring the correct adjustment of the substrate stack to the next substrate, which is to be bonded. In general, a new positioning of the alignment marks of the first substrate to the optical axes needs to thereby be carried out after every x and/or y movement of the lower substrate or substrate stack, respectively, by means of a movement of the lower substrate holder. This takes place very easily in particular when the alignment marks of the first substrate are located on the lower side, and are thus directly accessible for the lenses. If the alignment marks of the first substrate are covered by further substrates, because the stack has already been constructed, the first substrate or the further substrates, which are stacked on the first substrate, must be transparent in the wavelength range, in which the detectors and lenses operate. Such calibrations are necessary in particular when the substrate stack has to be shipped between different rooms, machines, companies or even countries.

It is the basic idea of all processes according to the invention to calibrate a plurality of substrates, which are stacked on top of one another, with regard to the alignments marks of a first, preferably lowermost substrate. The n+1 substrate is thus always calibrated to the first substrate, not to the n-th substrate.

Calibration Process

According to the invention, a calibration of the detection units prior to the actual alignment process is advantageous. The goal of the calibration is in particular to place the point of intersection of the optical axes of two detection devices, which are in each case located opposite one another, into the center of an alignment marking of a calibration substrate. This calibration preferably occurs separately for all lenses of the detection units. The calibration ensures that opposite (upper and lower) lenses of a detection unit have a common focal range, i.e. common or at least largely superimposing depths of field and common or at least largely superimposing fields of view. In the further course of the publication, focusing will thus always be understood such that the correct depths of field and/or fields of view are present to depict the object to be focused, in particular an alignment mark, as best as possible.

In a preferred embodiment, the optical axes of the two opposite lenses are collinear (congruent) to one another. For this purpose, the lenses in particular have rotational degrees of freedom, preferably by means of arrangement on a goniometer.

According to the invention, one or the point of intersection of the optical axes of the lenses is in particular arranged in such a way that the corresponding alignment markings of the substrates, which are to be aligned, can at least be focused and/or arranged or are arranged, respectively, in a detection position in the X, Y and Z direction in this point. In general, the positions of the alignment marks can change from substrate pair to substrate pair. According to the invention, traveling distances are further minimized by means of this measure. For general purposes, the following fact shall be mentioned. The case, which can hardly be realized technically, that two optical axes are collinear, are thus congruent to one another, would mean that there are an infinite number of points of intersection and that the z position, at which the measurement of the alignment marks occurs, can be chosen freely, as long as the z position is in the depth of field of the lenses.

The points of intersection of the optical axes are preferably in the focal plane of the lenses. Resolution and depth of field are two competing parameters. The larger the resolution, the smaller the depth of field and vice versa. When using lenses with a high resolution, they thus have a correspondingly small depth of field. The alignment marks of the upper and lower substrate thus need to simultaneously be within a very small depth of field, in order to still be depicted in focus. According to the invention, the point of intersection of the optical axes is arranged in the depth of field of the corresponding lenses. The resolution of the lenses is better than 100 μm, preferably better than 10 μm, more preferably better than 1 μm, most preferably better than 500 nm, most preferably of all better than 200 nm.

According to the invention, it is advantageous, when the lenses are calibrated in such a way that the contact surfaces and/or the alignment markings of the substrates are arranged in detection positions of the respective detection units within the depths of field. According to the invention, a refocusing can thus be forgone.

The mentioned calibration process can also be read in detail in publication WO2014202106A1, the disclosure content of which is added into the disclosure of the invention to this effect.

The two methods below frequently mention a centering of the alignments marks in relation to the lenses. In general, this means that the alignment marks must at least be located in the field of view and in the depth of field of the lens. In general, the alignment marks do not need to be in the center of the detector, which creates the capturing of the alignment marks via the lenses. In the further sense, the mentioned centering in particular always serves the purpose of aligning two alignment marks of different substrates relative to one another. In the publication, the word centering, however, is used more narrowly in an exemplary manner, in that it is used to describe a state, in which the alignment marks, in particular of the first substrate, come to rest as best as possible in the center of the lenses, in order to create the most optimal situation of the measurement.

First Method

In a first exemplary method according to the invention, the alignment of a plurality of substrates relative to one another takes place with regard to alignment marks, which are directed to the outside, of a first, lowermost substrate. The exact process sequence is as follows.

In a first method step 100 according to the invention of the first method according to the invention, a first, lowermost substrate is fixed to a lower substrate holder by means of alignment marks. The first substrate is thereby fixed to the substrate holder in such a way that alignment marks can be seen through recesses of the lower substrate holder, in particular can be measured. The alignment marks are outer alignment marks. The alignment marks specifically point downwards. Specific embodiments of the lower substrate holder demand that the substrate holder be lifted over the lens, so that the lower lenses can be sunk into the recesses. A lifting also becomes necessary in particular when the substrate holder leaves the process region completely and thus does no longer move only in the z direction after the first positioning in the x and y direction. In a particularly preferred embodiment of a substrate holder according to the invention, provision is made for access paths for the lenses, along which a contact-free relative movement between the lenses and the lower substrate holder can occur. The lower substrate holder is now positioned roughly until the alignment marks are located in a left or right field of view, respectively, of the lower lenses.

In a second process step 101 according to the invention of the first method according to the invention, the lower substrate holder moves in the z direction until the two alignment marks are located in the depth of field of the lenses. It can also be necessary thereby to perform a wedge error compensation, in order to align the outer surface of the first substrate parallel to the focal plane of the lenses. As soon as both alignment marks are located in the depth of field, they are depicted with sufficient focus to be capable of being measured.

In a third, optional process step 102 according to the invention of the first process according to the invention, the left and/or the right detection unit are then moved in the x and/or y direction until the left lower lens centers the left alignment mark and the right lower lens centers the right lower alignment mark. Strictly speaking, this centering is an optional step and does not need to be performed. The positions of the alignment marks can also be measured and stored in the state of the process step 101. The alignment marks of the substrates, which are to be stacked on the first substrate, will accordingly also be located farther away from the center of the lenses. However, the person of skill in the art in the field knows that the hardware and software always measure the alignment marks of two substrates, which are to be aligned to one another, correctly, and can correlate them with one another, as long as they are located in the depth of field and in the field of view of the lens. However, a corresponding centering is preferably performed.

In a fourth process step 103 according to the invention of the first process according to the invention, the lower substrate holder is preferably lowered. The lower substrate holder needs to be capable of being moved in the z direction with a high precision. Corresponding methods for accomplishing a highly accurate movement are mentioned in other parts of the publication. It is also conceivable, however, for the lower substrate holder to move out of the process region and to return again in a later process step. This is highly dependent on the used aligner. In this case, in particular the x and/or y positioning of the lower substrate holder needs to be highly precise. The movement out of the process region can in particular be accompanied by a lifting of the substrate holder over the lenses, so as to avoid a collision.

In a fifth process step 104 according to the invention of the first process according to the invention, the upper substrate holder is moved into the process region. The upper substrate holder is preferably designed in such a way that it can only move in the x and y direction. However, an additional motor unit would also be conceivable, which allows in particular for a highly accurate positioning in the z direction. After an upper, second substrate has been fixed on the upper substrate holder, the upper substrate holder is moved until the upper, outer alignment marks are centered by the upper lenses. In the further sense, this centering also accomplishes the alignment of the upper substrate to the lower substrate via the alignment marks thereof. This corresponds to an alignment of the upper substrate to the lower substrate by means of the alignment marks of the upper and lower substrate. The detection units must not be moved any longer.

In a sixth process step 105 according to the invention of the first process according to the invention, the bonding process occurs between the first substrate and the second substrate. A relative approach of the two substrates to one another occurs thereby. According to the invention, the relative approach preferably occurs by means of an approach of the lower substrate holder to the upper substrate holder. It is also conceivable, however, that one of the two substrates or both substrates are bent out, in particular symmetrically, by means of a further device, which is not described in more detail, and thus resulting in an in particular centrical contacting of the two substrates or substrate surfaces, respectively. The upper substrate is preferably always bent out, because the upper substrate is always an individual substrate, while, in the further course of the process, the substrate stack forms on the lower substrate holder. To be able to bend a substrate stack can be more complicated. Substrate holders for bending are described and disclosed in particular in publications PCT/EP2016/056249 and WO201491033A1.

In a seventh process step 106 according to the invention of the first process according to the invention, a substrate stack comprising two substrates is present, which has alignment marks on the outer sides of both substrates. In this state, in particular the two substrates are connected to one another inseparably, preferably not easily separable, either by means of a direct bond, in particular a prebond or fusion bond, or by means of a temporary bond. In the case of a temporary bond, in particular the adhesive has already been hardened, preferably thermally, more preferably by means of exposure, preferably by means of UV exposure. If it should be determined by means of a subsequent metrology step that the alignment of the two substrates relative to one another is not optimal and that it can only be a connection, which is not easily separable, in particular a prebond, the method from publication WO2013091714A1 can preferably be used in order to separate the two substrates from one another again and to supply the two substrates to a new processing. In particular the outer alignment marks of the lower substrate, viewed through the substrate stack, are congruent to the outer alignment marks of the upper substrate. The created substrate stack is lowered again in the z direction. It is also conceivable in this case that the created substrate stack is not lowered, but is, in turn, moved out of the press region, in order to return again in a later process step. The movement out of the process region can in particular be accompanied by a lifting of the substrate holder over the lenses, so as to avoid a collision. In a further embodiment, it may even be necessary to ship the substrate stack, which was created in this way, to a different system, company or even another country, in order to perform the further process steps at other systems.

Starting at that point, the first process according to the invention can be continued with any further substrates, which are fixed to the upper substrate holder, and can be repeated, starting at process step 104. The largest error, which can occur thereby, refers to the faulty alignment between the lowermost substrate and the uppermost substrate, which is to be bonded. An error propagation of the alignment beyond the substrate stack does not happen.

In a ninth process step 108 according to the invention of the first process according to the invention, the final substrate stack is obtained, which can be removed and then unloaded by a removal of the lower substrate holder from the process region.

Second Method

In a second exemplary method according to the invention, the alignment of a plurality of substrates relative to one another takes place with regard to alignment marks, which are directed to the inside, of a first, lowermost substrate. The process sequence is as follows.

In a first process step 200 according to the invention of the second method according to the invention, a first, lowermost substrate with alignment marks is fixed to the lower substrate holder. The alignment marks are thereby measured by the upper lenses. The alignment marks specifically point upwards. In a specific embodiment, the alignment marks can also be measured by lenses on the lower side. However, this requires that the substrate needs to be transparent for the electromagnetic radiation, which can be detected by the lower lenses. In particular, silicon substrates are infrared-transparent. In the further course of the publication, the second process according to the invention will be described exclusively by means of the upper side lenses, which are directed directly to the alignment marks, which are to be measured. The lower substrate holder is now positioned roughly until the alignment marks are located in a left or right field of view, respectively, of the upper lenses.

In a second process step 201 according to the invention of the second process according to the invention, the lower substrate holder moves in the z direction until the two alignment marks are located in the depth of field of the upper lenses. It can also be necessary thereby to perform a wedge error compensation, in order to align the outer surface of the lower substrate parallel to the focal plane of the lenses. As soon as both alignment marks are located in the depth of field, they are depicted with sufficient focus to be capable of being measured.

In a third, optional process step 202 according to the invention of the second process according to the invention, the left and/or the right detection unit are then moved in the x and/or y direction until the left upper lens centers the left alignment mark and the right upper lens centers the right lower alignment mark. The considerations with regard to focusing are identical to the statements in the process step 102 of the first process and are adopted here.

In a fourth process step 203 according to the invention of the second process according to the invention, the lower substrate holder is lowered. The lower substrate holder needs to be capable of being moved in the z direction with a high precision. Corresponding methods for accomplishing a highly accurate movement are mentioned in other parts of the publication. It is also conceivable, however, for the lower substrate holder to move out of the process region and to return again in a later process step. This is highly dependent on the used aligner. In this case, in particular the x and/or y positioning of the lower substrate holder needs to be highly precise. The movement out of the process region can in particular be accompanied by a lifting of the substrate holder over the lenses, so as to avoid a collision. All further process steps are identical to the process steps 104-107.

In a fifth process step 204 according to the invention of the second process according to the invention, the upper substrate holder is moved into the process region. The upper substrate holder is preferably designed in such a way that it can only move in the x and y direction. However, an additional motor unit would also be conceivable, which allows in particular for a highly accurate positioning in the z direction. After the upper substrate has been fixed on the upper substrate holder, the upper substrate holder is moved until the upper alignment marks are centered by the upper lenses. In the further sense, this centering also accomplishes the alignment of the upper substrate to the lower substrate via the alignment marks thereof. This corresponds to an alignment of the upper substrate to the lower substrate by means of the alignment marks of the upper and lower substrate. The detection units must not be moved any longer.

In a sixth process step 205 according to the invention of the second process according to the invention, the bonding process occurs between the first substrate and the second substrate. A relative approach of the two substrates to one another occurs thereby. According to the invention, the relative approach preferably occurs by means of an approach of the lower substrate holder to the upper substrate holder. It is also conceivable, however, that one of the two substrates or both substrates are bent out, in particular symmetrically, by means of a further device, which is not described in more detail, and thus resulting in an in particular centrical contacting of the two substrates or substrate surfaces, respectively. The upper substrate is preferably always bent out, because the upper substrate is always an individual substrate, while, in the further course of the process, the substrate stack forms on the lower substrate holder. To be able to bend a substrate stack can be more complicated.

In a seventh process step 206 according to the invention of the second process according to the invention, a substrate stack comprising two substrates is present, which has alignment marks only on its upper substrate. The created substrate stack is lowered in the z direction again. It is also conceivable in this case that the created substrate stack is not lowered, but is, in turn, moved out of the process region, in order to return again in a later process step. The movement out of the process region can in particular be accompanied by a lifting of the substrate holder over the lenses, so as to avoid a collision. In a further embodiment, it may even be necessary to ship the substrate stack, which was created in this way, to a different system, company or even another country, in order to perform the further process steps at other systems.

Starting at that point, the second process according to the invention can be continued with any further substrates, which are fixed to the upper substrate holder, and can be repeated, starting at process step 204. The largest error, which can occur thereby, refers to the faulty alignment between the lowermost substrate and the uppermost substrate, which is to be bonded. An error propagation of the alignment beyond the substrate stack does not happen.

In a ninth process step 208 according to the invention of the second process according to the invention, the final substrate stack is then obtained, which can be removed and then unloaded by a removal of the lower substrate holder from the process region.

Further advantages, features and details of the invention result from the following description of preferred exemplary embodiments as well as from the drawings.

BRIEF DESCRIPTION OF THE DRAWINGS

FIG. 2e shows a fifth step of the first method according to the invention, FIG. 2f shows the sixth step of the first method according to the invention.

FIG. 3c shows a third, optional step of the second method according to the invention, FIG. 3d shows a fourth step of the second method according to the invention.

FIG. 3i shows a ninth step of the second method according to the invention, FIG. 4a shows a schematic, not to scale upper view of a first substrate holder according to the invention, FIG. 4b shows a schematic, not to scale upper view of a second substrate holder according to the invention, FIG. 5a shows a first flow chart, FIG. 5b shows a second flow chart.

Identical components or components with the identical function are identified with identical reference numerals in the figures.

DETAILED DESCRIPTION OF THE INVENTION

Publication U.S. Pat. No. 6,214,692 B1 discloses an exemplary device for carrying out the following method. The disclosure of this publication is thus included in this description.

A left detection unit 8l has a lower left lens 7ul and an upper left lens 7ol. A right detection unit 8r has a lower right lens 7ur and an upper right lens 7or.

Figure 1A:
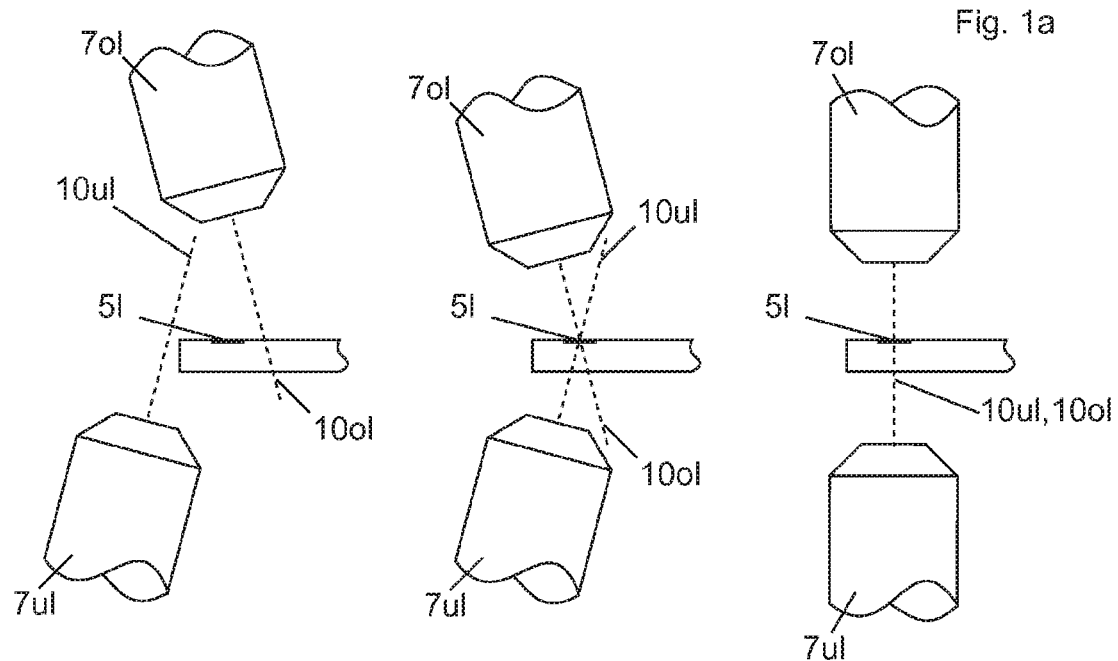
FIG. 1a shows three different options of positions of optical axes of two lenses relative to one another.

FIG. 1a shows three different options of positions of optical axes 10ol, 10ul of the left lenses 7ul, 7ol relative to one another. In the first case (left), there is no point of intersection of the optical axes 10ul, 10ol. In the second case (middle), the optical axes 10ol intersect in a left alignment mark 5l on a substrate. This is the most frequently occurring case. In the third case (right), the two optical axes 10ul, 10ol are collinear (congruent) and centrically pierce the left alignment mark 5l. This is the optimal case. Prior to the method according to the invention, the lenses 7ol, 7ul are calibrated in such a way that at least the middle (second) case is realized, the right (third) case is to be realized, if possible.

Figure 1B:
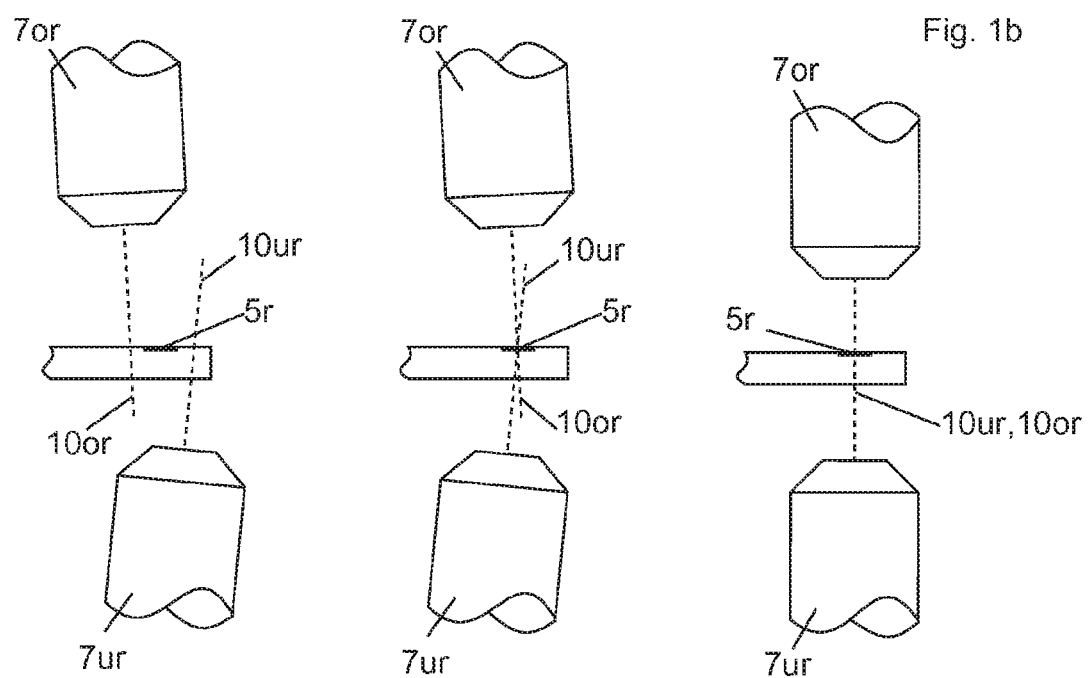
FIG. 1b shows three further options of positions of optical axes of two lenses relative to one another.

FIG. 1b shows three different options of positions of optical axes 10or, 10ur of the right lenses 7ur, 7or relative to one another. In the first case (left), there is no point of intersection. In the second case (middle), the optical axes 10or, 10ur intersect in a right alignment mark 5r. This is the most frequently occurring case. In the third case (right), the two optical axes 10or, 10ur are collinear and centrically pierce the right alignment mark 5r. This is the optimal case. Prior to the method according to the invention, the lenses 7or, 7ur are calibrated in such a way that at least the middle case is realized, the right case is to be realized, if possible.

Figure 2A:
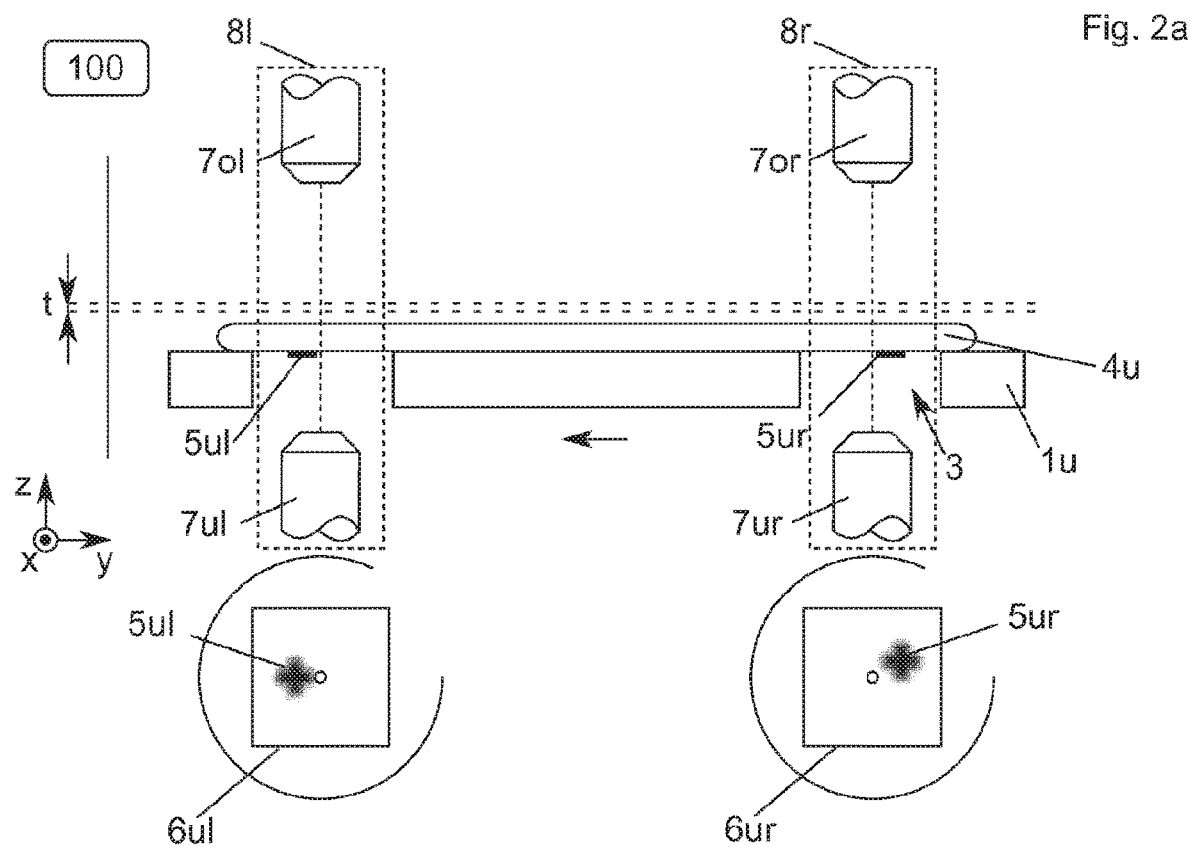
FIG. 2a shows a first step of a first method according to the invention.

FIG. 2a shows a first process step 100 of a first exemplary method according to the invention.

A lower substrate 4u has a lower, left alignment mark 5ul and a lower, right alignment mark 5ur, and is fixed to a lower substrate holder 1u in such a way that the alignment marks 5ul, 5ur for the lower left lens 7ul and the lower right lens 7ur can be detected and measured through recesses 3 in the substrate holder 1u (see upper illustration of FIG. 2a). In general, the alignment marks 5ul, 5ur are not yet in a depth of field t of the lenses 7ul, 7ur at that point in time, whereby the alignment marks 5ul, 5ur appear to be correspondingly out of focus. The alignment marks 5ul, 5ur, however, should preferably already at least be in fields of view 6ul, 6ur of the lenses 7ul, 7ur (see lower illustrations). This can be attained by means of a mechanical preadjustment (suggested by means of the arrow). If the alignment marks 5ul, 5ur are not yet in the fields of view 6ul, 6ur, the detection units 8l, 8r must at least be moved in the x and/or y direction until the alignment marks 5ul, 5ur become visible for the lower lenses 7ul, 7ur. The exact alignment of the detection units 8l, 8r on the alignment marks 5ul, 5ur only occurs in FIG. 2c. The lenses 7ul, 7ur must not be moved individually, because previously performed calibration would otherwise be lost.

Figure 2B:
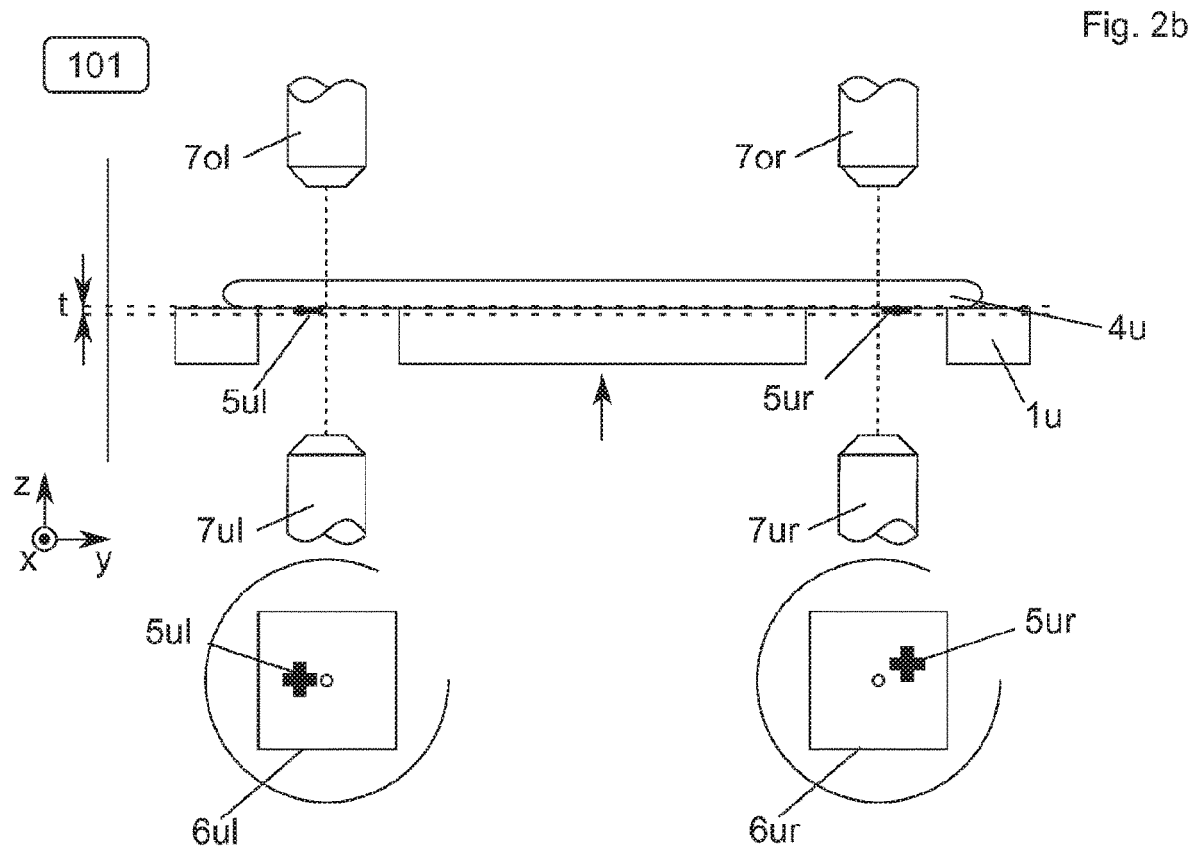
FIG. 2b shows a second step of the first method according to the invention.

FIG. 2b shows a second process step 101 of the method. The lower substrate holder 1u is moved in the Z direction (suggested by means of the arrow), until the two alignment marks 5ul, 5ur of the lower substrate 4u are located in the depth of field t. If necessary, a wedge error compensation can also be performed in this process step. A wedge error can be detected in that one of the two alignment marks 5ul, 5ur is depicted out of focus, because it is located outside of the depth of field t, while the second one of the alignment marks 5ul, 5ur is depicted in focus, because it is still located inside the depth of field t. The wedge error, however, is preferably detected by means of more precise measuring devices, in particular by means of interferometers, and is corrected by tilting the lower substrate holder 1u accordingly.

FIG. 2e shows a third, optional process step 102. The detection units 8l, 8r are thereby moved in the X and/or Y direction (suggested by means of the arrow), until the alignment marks 5ul, 5ur have been centered by the lower lenses 7ul, 7ur, or until the alignment marks 5ul, 5ur are illustrated in a centered manner in the lenses 7ul, 7ur. The alignment marks 5ul, 5ur then coincide as accurately as possible, preferably exactly, with the points of intersection of the optical axes of the lenses 7ul, 7ol or 7ur, 7or, respectively. The detection units 8l, 8r with the lenses 7ul, 7ur, 7ol, 7or are then fixed and are no longer moved during the process according to the invention. The translational positions and/or rotational positions of the lower substrate holder 1u are stored.

Figure 2C:
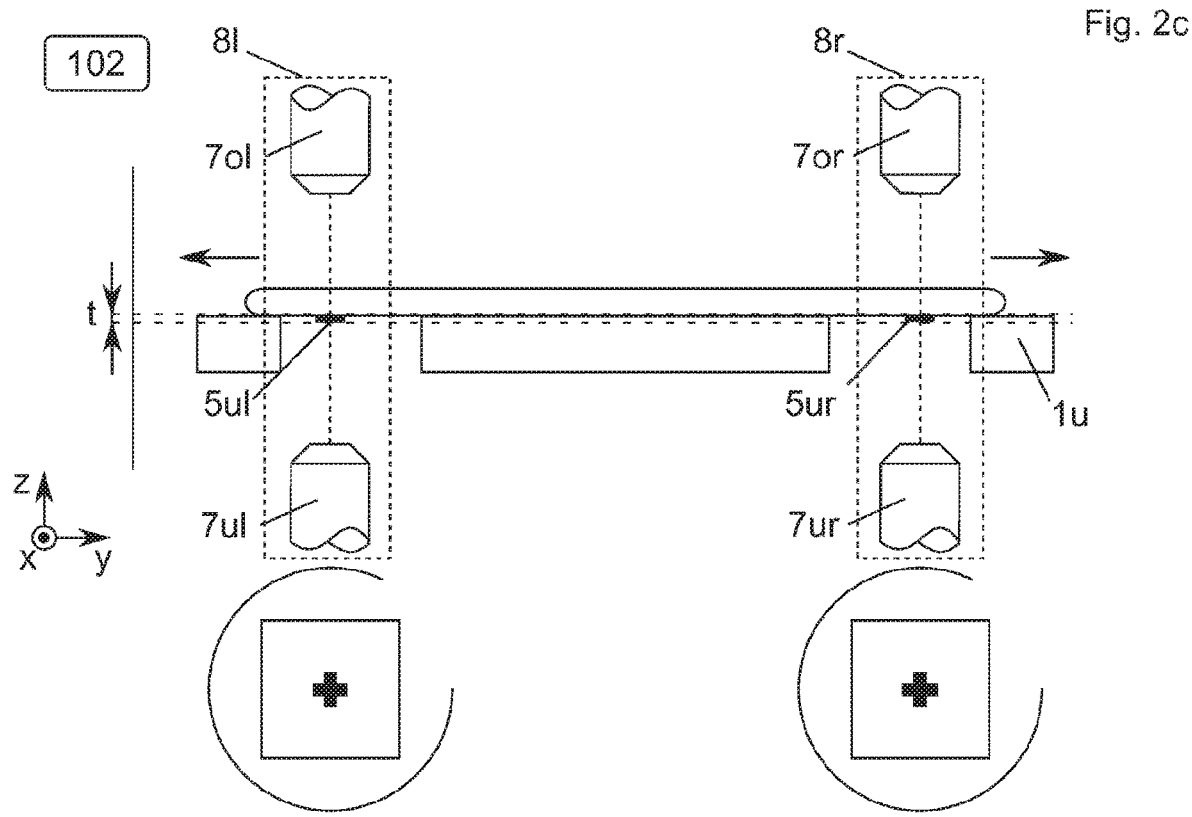
FIG. 2c shows a third, optional step of the first method according to the invention.
Figure 2D:
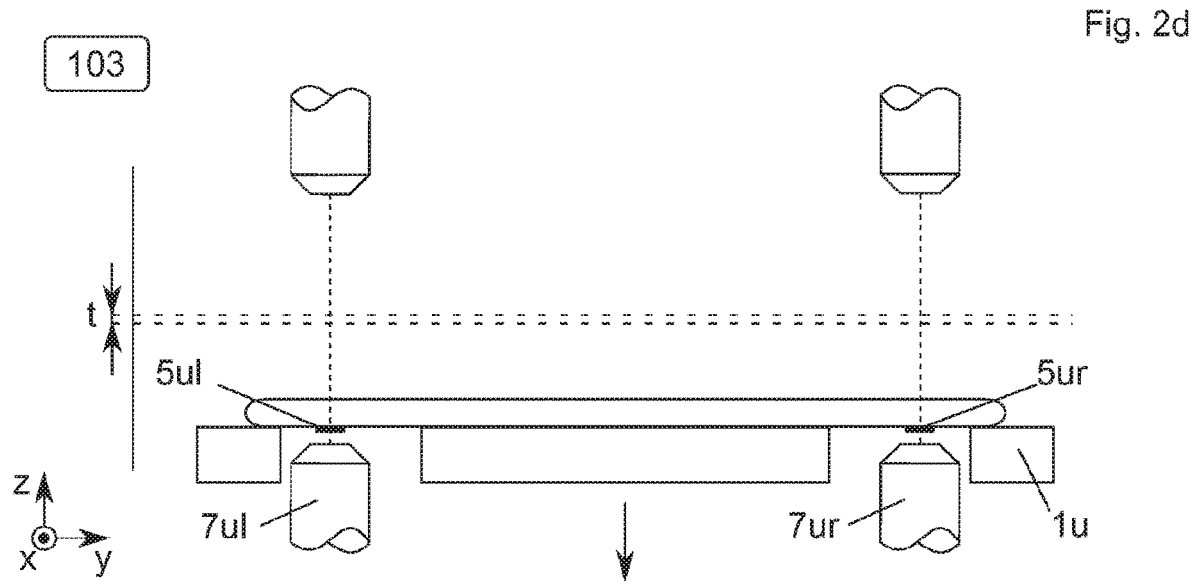
FIG. 2d shows a fourth step of the first method according to the invention.

FIG. 2d shows a fourth process step 103. The lower substrate lu is moved in the negative z direction (suggested by means of the arrow), to clear a process region for an upper substrate holder 1o (not illustrated). It is necessary thereby to move the lower substrate holder 1u as precisely as possible. As precisely as possible means that the deviation of the lower substrate holder 1u in the x and/or y direction with movement in the z direction needs to be minimal. In an alternative embodiment according to the invention, the substrate holder iu can also be moved out of the process region. The substrate holder 1u must then be moved into the process region again prior to the process step 105 from FIG. 2f.

FIG. 2e shows a fifth process step 104. The upper substrate holder to positions (suggested by means of the arrow) a loaded and fixed upper substrate 4o (see lower illustration) in such a way that upper alignment marks 5ol, 5or on the upper side of the upper substrate 4o are located in fields of view 6ol, 6or of the upper lenses 7ol, 7or and are centered correctly (see upper illustrations). The upper substrate holder 1 o is preferable constructed in such a way that only a movement in the x and y direction, but not in the z direction is possible. By loading the upper substrate 4o on the upper substrate holder 1o, the upper alignment marks 5ol, 5or are thus preferably already in the depth of field range t. However, a device, in which the upper substrate holder 1o can in fact be moved in the z direction, at least across short distances, to compensate for small height errors, is also conceivable.

The process step 103 from FIG. 2d and the process step 104 from FIG. 2c in particular occur simultaneously.

FIG. 2f show a sixth process step 105. In this process step, the fixing and/or bonding process of the two substrates 4u, 4o occurs. In general, a relative approach of the two substrates 4u and 4o occurs. In a specific, illustrated embodiment according to the invention, the lower substrate holder 1u moves the lower substrate 4u in the z direction on contact with the upper substrate 4o (suggested by means of the arrow). A very important aspect is that the deviation of the lower substrate holder 1u in the x and/or y direction in relation to the ideal x and/or y position is minimal at the time of the contact between an upper substrate surface 4u of the lower substrate 4u and a lower substrate surface 4os of the upper substrate 4o. In another embodiment according to the invention, it would also be possible in this process step, to bring the upper substrate holder to closer to the lower substrate holder 1u. Analogous considerations then apply for the highly precise positioning in the z direction. In a very specific embodiment according to the invention, both substrate holders 1u and 1o would approach one another.

Figure 2G:
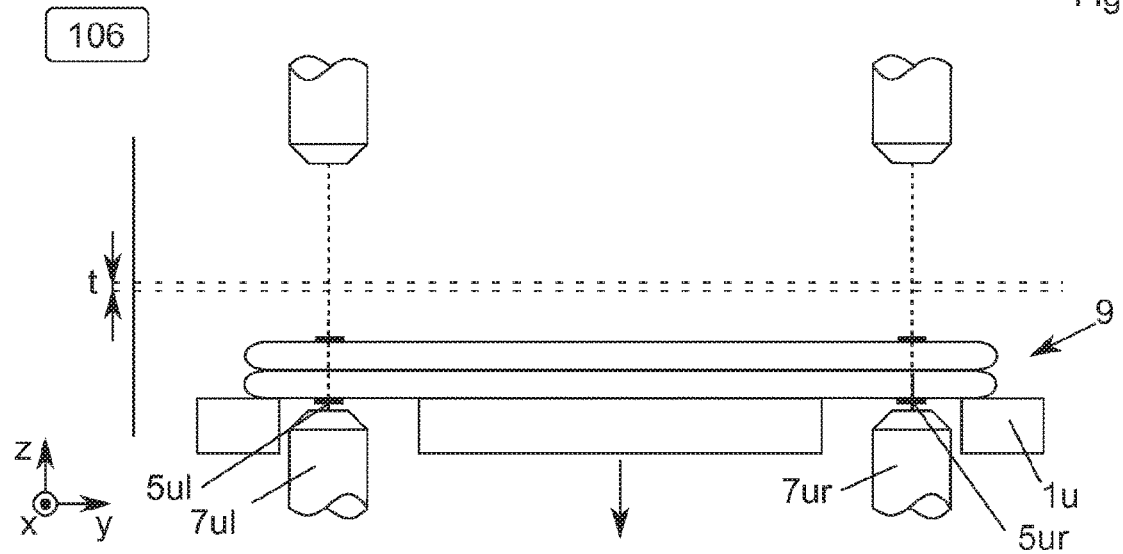
FIG. 2g shows a seventh step of the first method according to the invention.

FIG. 2g shows a seventh process step 106, in which the lower substrate holder 1u is moved in the negative z direction (suggested by means of the arrow) with a formed substrate stack 9, which is comprised of the first two bonded substrates 4u, 4o, to clear the process region for the upper substrate holder 1o. It is also conceivable that the substrate holder 1u leaves the process region and returns at a point in time prior to the next bonding process. The process steps 104-106 can now be performed several times.

Figure 2H:
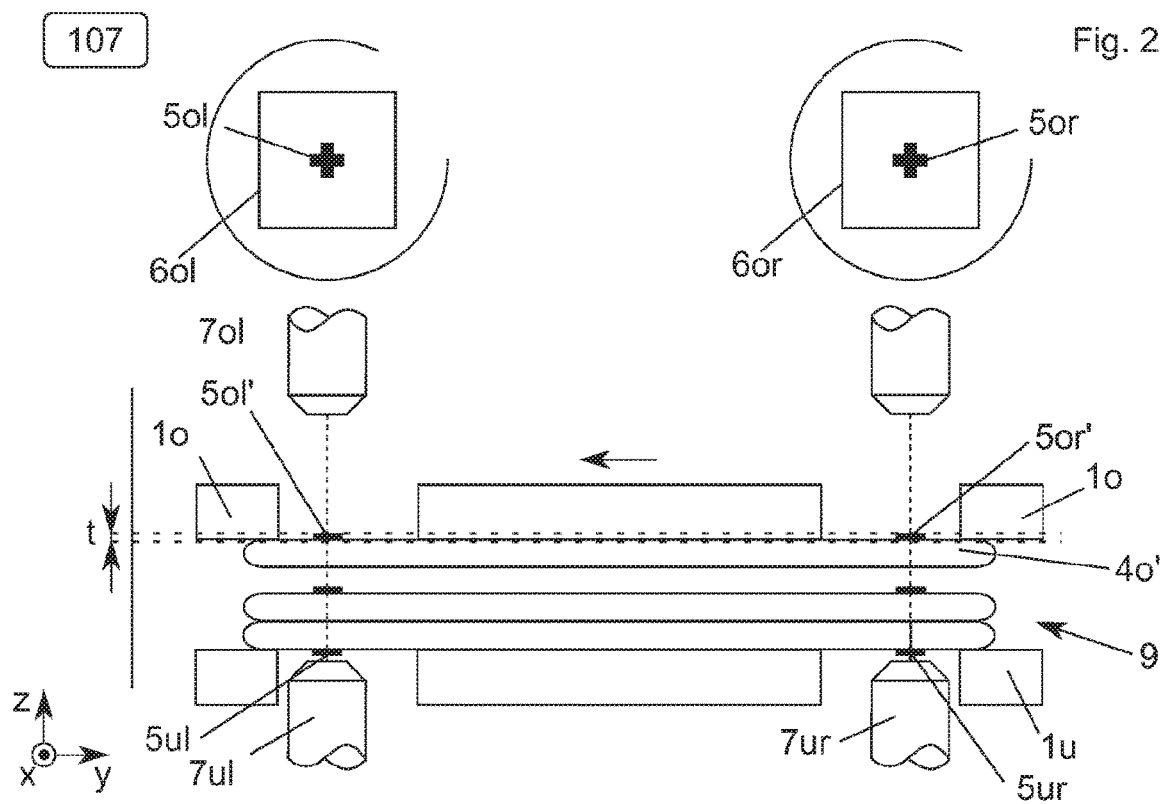
FIG. 2h shows an eighth step of the first method according to the invention.
Figure 2I:
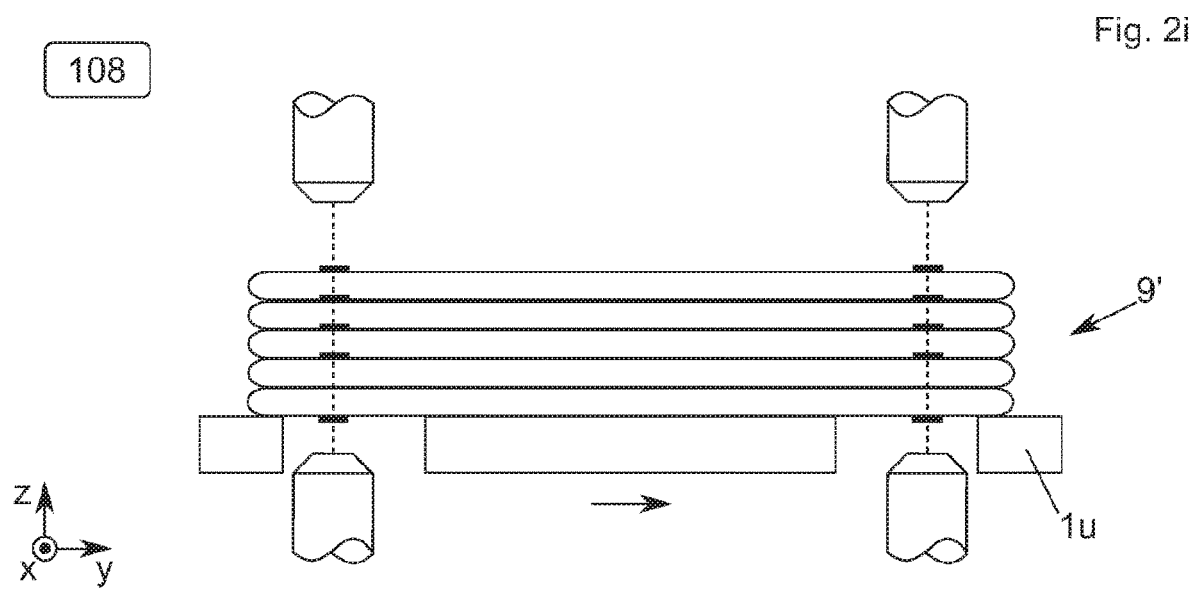
FIG. 2i shows a ninth step of the first method according to the invention.

FIG. 2h show an eighth process step 107, in which a third substrate 4o' with alignment marks 5ol', 5or' is fixed on its upper side by the upper substrate holder, and is arranged above the substrate stack 9. Analogous to FIG. 2e or step 104, respectively, the upper substrate holder 1o (suggested by means of the arrow) positions the loaded and fixed further upper substrate 4o' (see lower illustration) in such a way that the upper alignment marks 5ol', 5or' are located on the upper side of the upper substrate 4o in the fields of view 6ol, 6or of the upper lenses 7ol, 7or and are centered correctly (see upper illustrations). The upper substrate holder 1o is preferably constructed in such a way that only a movement in the x and y direction, but not in the z direction is possible. By loading the upper substrate 4o' on the upper substrate holder 1o, the upper alignment marks 5ol', 5or' are thus preferably already in the depth of field range t. However, a device, in which the upper substrate holder 1o can in fact be moved in the z direction, at least across short distances, to compensate for small height errors, is also conceivable.

The bonding process follows analogously to FIG. 2f or step 105, respectively, as well as the clearing of the process region analogously to FIG. 2g or step 106, respectively.

Further substrates can then be aligned and bonded analogously to steps 107, 105, 106. According to the invention, the substrate n+1, which is to be bonded, is aligned to the first substrate and not to the n-th substrate, so that the alignment error can be minimized.

Figure 3A:
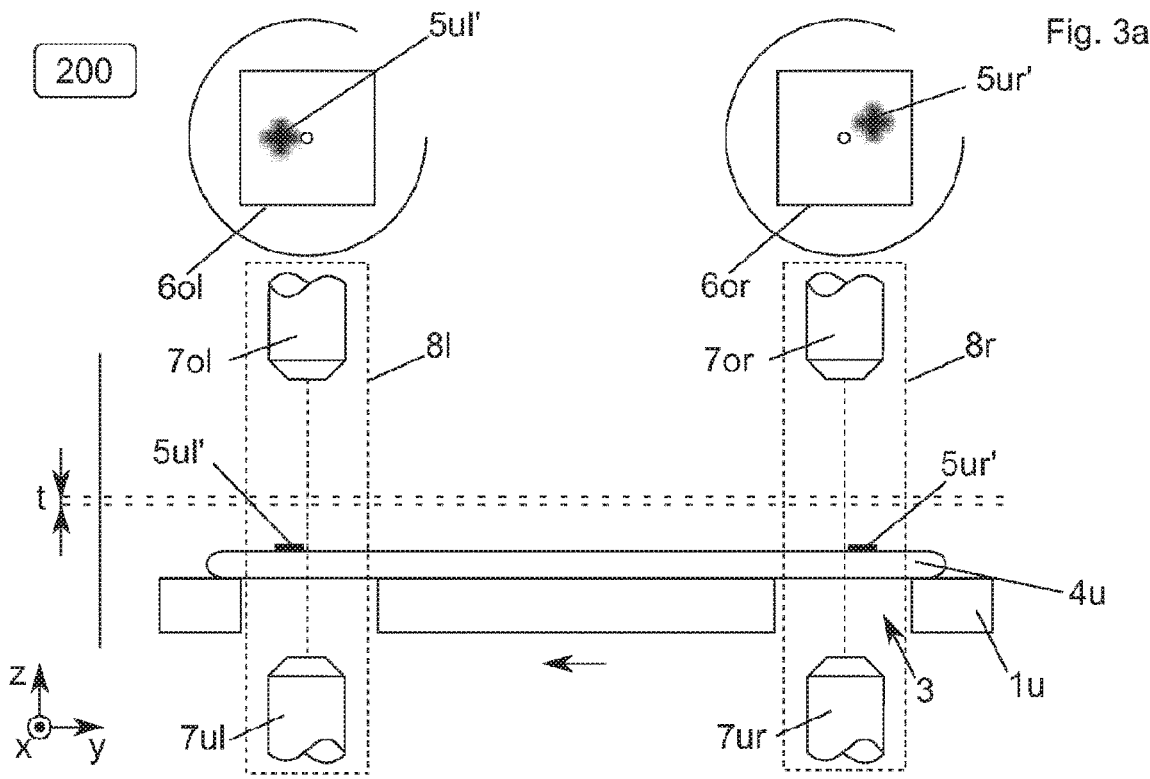
FIG. 3a shows a first step of a second method according to the invention.

FIG. 3a shows a first method step 200 of a second exemplary method according to the invention. A left lower alignment mark 5ul' and a right lower alignment mark 5ur' are arranged on the upper side of the lower substrate 4u (see lower illustration). In general, the alignment marks 5ul', 5ur' are not yet in a depth of field t of the lenses 7ol, 7or at that point in time, whereby the alignment marks 5ul', 5ur' appear to be correspondingly out of focus (see upper illustrations). The alignment marks 5ul', 5ur', however, should preferably already at least be in fields of view 6ol, 6or. This can always be attained by means of a mechanical preadjustment. If the alignment marks 5ul', 5ur' are not yet located in the fields of view 6ol, 6or, the detection units 8l, 8r must be moved in the x and/or y direction until the alignment marks 5ul', 5ur' for the upper lenses 7ol, 7or become visible. In contrast to the first process, only the upper lenses 7ol and 7or are preferably used. The detection units 8l, 8r are nonetheless moved as a whole. The lower lenses 7ul, 7ur could be used to detect the alignment marks 5ul', 5ur', provided that the substrate 4u is transparent.

In this case, an observation of all alignment marks 5ul', 5ur', 5ol, 5or from the upper side, and an observation of the alignment marks 5ul', 5ur' from the lower side would be possible. However, this would not change anything about the process according to the invention, because the calibration of each substrate also occurs to the respective first substrate in this case. Even though the lower lenses 7ul, 7or are still illustrated in the further figures, they are not described in detail.

Figure 3B:
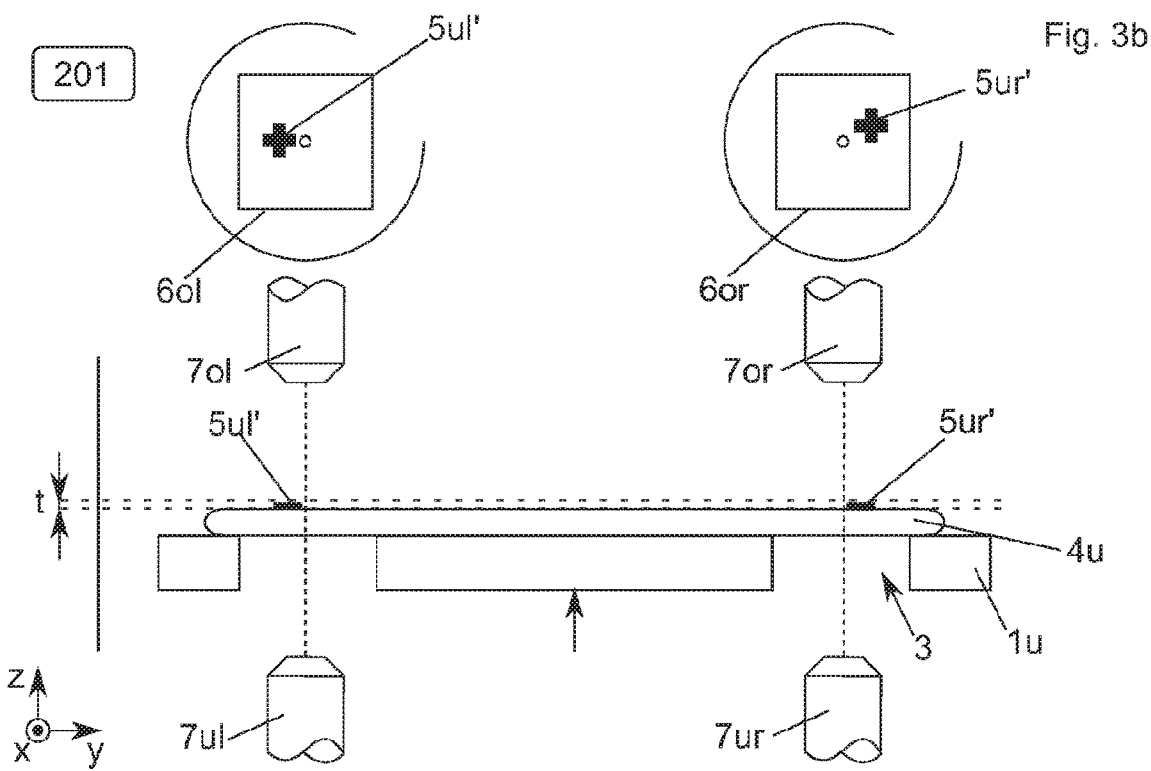
FIG. 3b shows a second step of the second method according to the invention.
Figure 3E:
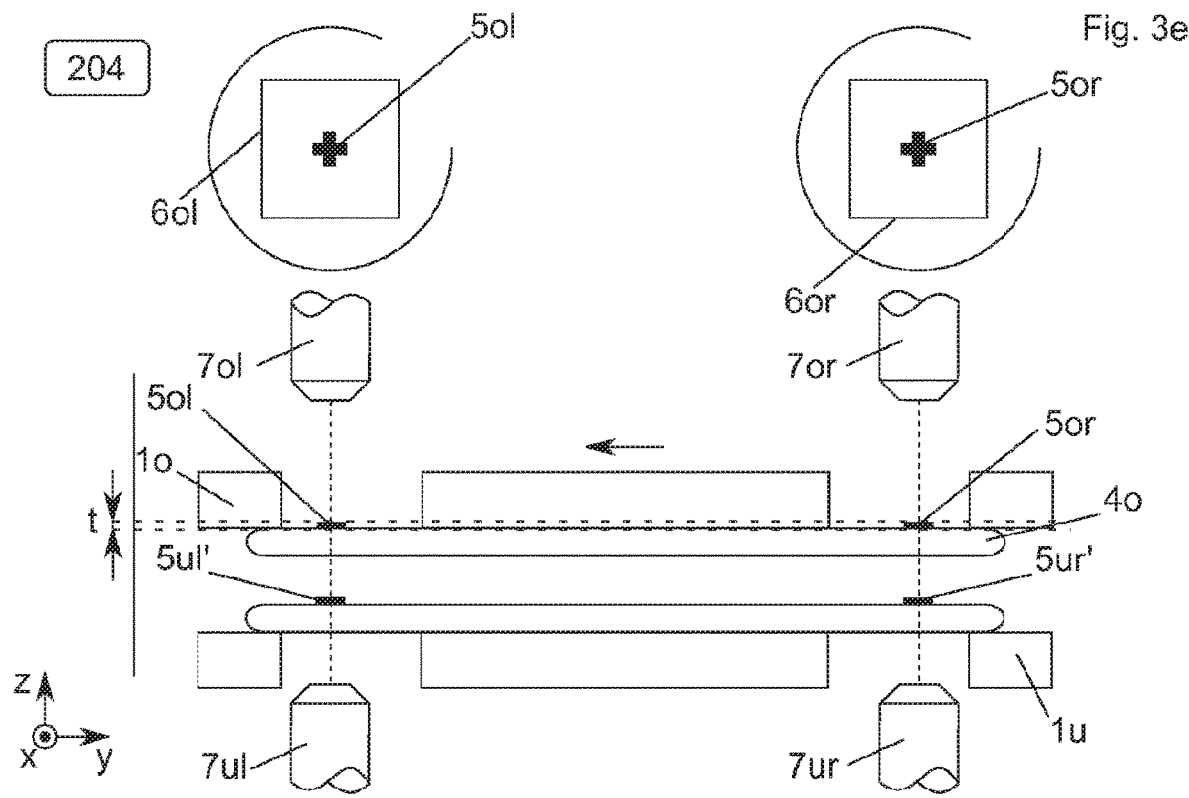
FIG. 3e shows a fifth step of the second method according to the invention.

FIG. 3b shows a second method step 201 of the second method according to the invention. The lower substrate holder 10 is moved in the Z direction, until the two alignment marks 5ul', 5ur' of the lower substrate 4u are located in the depth of field t. If necessary, a wedge error compensation can also be performed in this process step. A wedge error can be detected in that one of the two alignment marks 5ul', 5ur' is depicted out of focus, because it is located outside of the depth of field t, while the second one of the alignment marks 5u', 5ur' is illustrated in focus, because it is still located within the depth of field t. The wedge error, however, is preferably detected by means of more precise measuring devices, in particular by means of interferometers, and is corrected by tilting the lower substrate holder 1u accordingly, FIG. 3e shows a third, optional process step 202. The detection units 8l, 8r are thereby moved in the Z direction, until the alignment marks 5ul', 5ur' have been centered by the upper lenses 7ol, 7or. The detection units 8l and 8r are then fixed and are no longer moved during the process according to the invention. The translational positions and/or rotational positions of the lower substrate holder 1u are stored.

FIG. 3d shows a fourth process step 203. The lower substrate 1u is moved in the negative z direction, in order to clear the process region for the upper substrate holder 1o. It is necessary thereby to move the lower substrate holder 1u as precisely as possible. As precisely as possible means that the deviation of the lower substrate holder 1u in the x and/or y direction with movement in the z direction needs to be minimal. In an alternative embodiment according to the invention, the substrate holder 1u can also be moved out of the process region. The substrate holder 1u must then be moved into the process region again prior to the process step 205 from FIG. 3f.

FIG. 3e shows a fifth process step 204. The upper substrate holder 1o positions the loaded and fixed upper substrate 4o in such a way that upper alignment marks 5ol, 5or are located in the fields of view 6ol, 6or of the upper lenses 7ol, 7or and are centered correctly. The upper substrate holder 1o is preferable constructed in such a way that only a movement in the x and y direction, but not in the z direction is possible. By loading the upper substrate 4o on the upper substrate holder 1c, the upper alignment marks 5ol, 5or are thus preferably already located in the depth of field range t. However, a device, in which the upper substrate holder 4o can in fact be moved in the z direction, at least across short distances, to compensate for small height errors, is also conceivable.

Figure 3F:
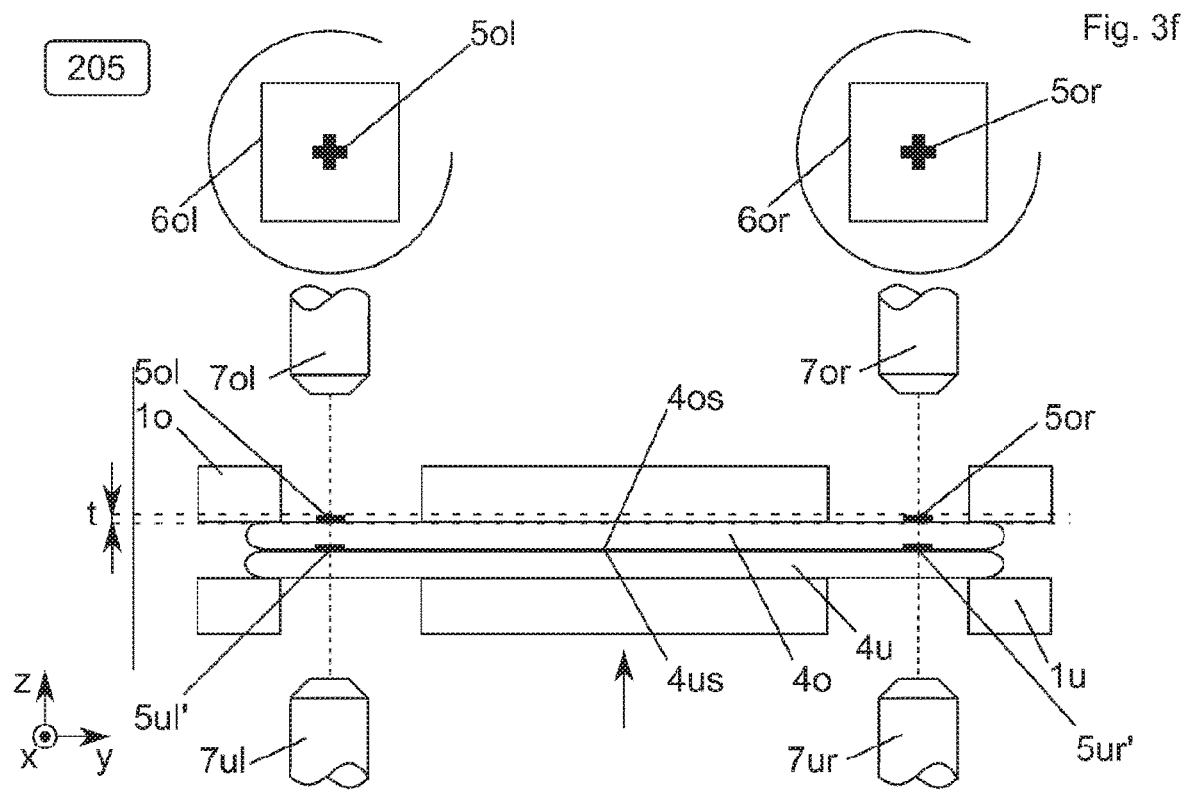
FIG. 3f shows a sixth step of the second method according to the invention.

The process step 203 from FIG. 3d and the following process step 204 from FIG. 3f in particular take place simultaneously.

FIG. 3f show a sixth process step 205. In this process step, the fixing and/or bonding process of the two substrates 4u, 4o occurs. In general, a relative approach of the two substrates 4u and 4o occurs. In a specific, illustrated embodiment according to the invention, the lower substrate holder 1u moves the lower substrate 4u on contact with the upper substrate 4o. A very important aspect according to the invention is that the deviation of the lower substrate holder 1u in the x and/or y direction in relation to the ideal x and/or y position is minimal at the time of the contact between the upper substrate surface 4us and the substrate surface 4os. In another embodiment according to the invention, it would also be possible in this process step, to bring the upper substrate holder 1o closer to the lower substrate holder 1u. Analogous considerations then apply for the highly precise positioning in the z direction. In a very specific embodiment according to the invention, both substrate holders 1u and 1o would approach one another.

Figure 3G:
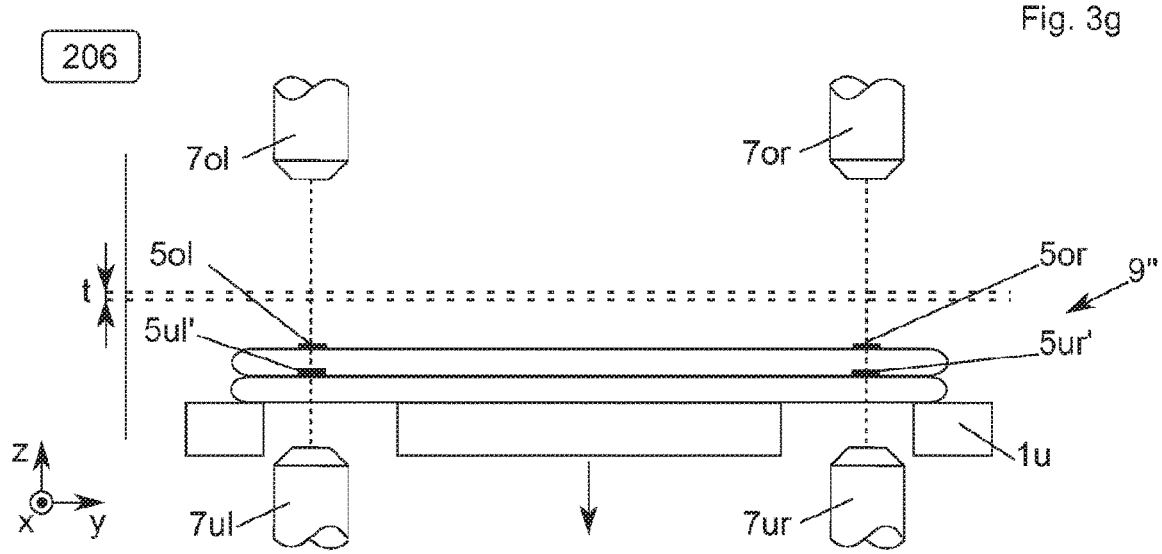
FIG. 3g shows a seventh step of the second method according to the invention.

FIG. 3g shows a seventh process step 206, in which the formed substrate stack 9'', which was bonded from the first two substrates 4u, 4o, is moved in the negative z direction, to clear the process region for the upper substrate holder 1o. It is also conceivable that the substrate holder 1u leaves the process region and returns at a point in time prior to the next bonding process. The process steps 204-206 can now be performed several times.

Figure 3H:
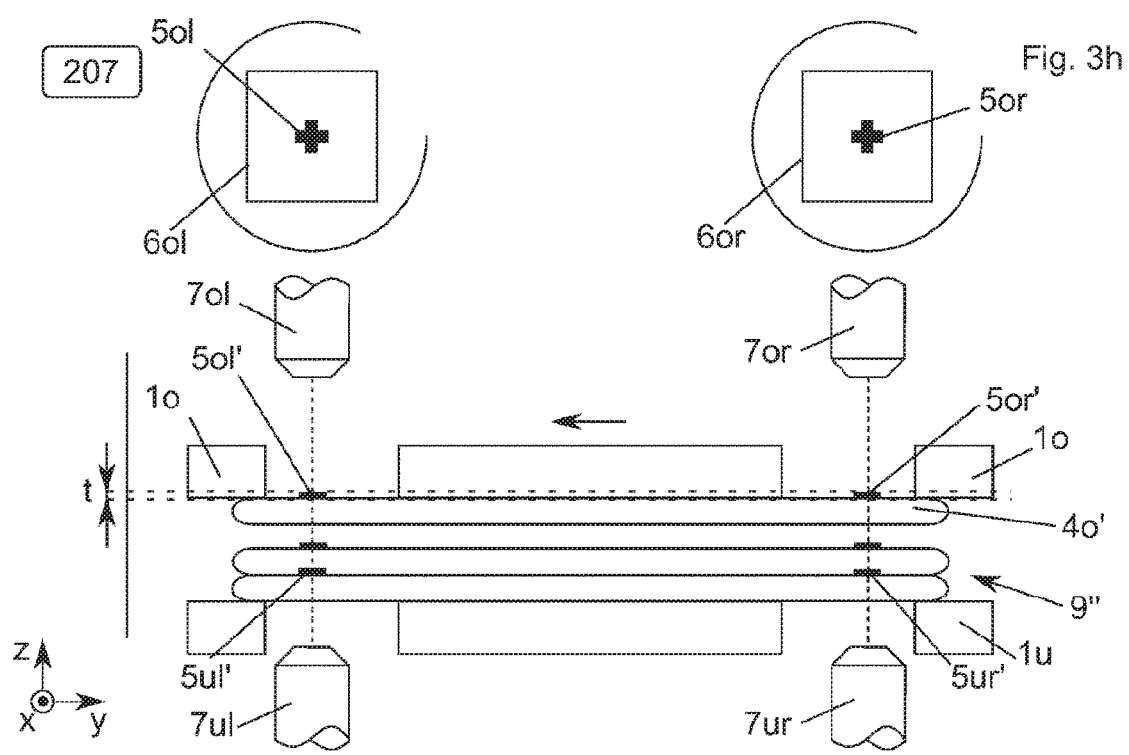
FIG. 3h shows an eighth step of the second method according to the invention.

FIG. 3h shows an eighth process step 207, in which a third substrate 4o' with alignment marks 5ol', 5or' is fixed on its upper side by the upper substrate holder, and is arranged above the substrate stack 9'', Analogous to FIG. 3e or step 204, respectively, the upper substrate holder 1o (suggested by means of the arrow) positions the loaded and fixed further upper substrate 4o' (see lower illustration) in such a way that the upper alignment marks 5ol', 5or' are located on the upper side of the upper substrate 4o in the fields of view 6ol, 6or of the upper lenses 7ol, 7or and are centered correctly (see upper illustrations). The upper substrate holder 1o is preferably constructed in such a way that only a movement in the x and y direction, but not in the z direction is possible. By loading the upper substrate 4o' on the upper substrate holder 1o, the upper alignment marks 5or' are thus preferably already located in the depth of field range t. However, a device, in which the upper substrate holder to can in fact be moved in the z direction, at least across short distances, so as to compensate for small height errors, is also conceivable.

FIG. 3i shows an eighth process step 207, in which the complete substrate stack 9''' is unloaded from the lower substrate holder 1u.

Apart from that, the statements made with regard to the first process apply for the second process.

FIG. 4a shows a schematic, not to scale upper view of a first substrate holder 1 according to the invention, comprising a substrate holder plate, on which, in particular a plurality of fixing elements 2 are present to fix a substrate 4 (only illustrated partially). The fixing elements 2 are preferably vacuum fixations, in particular vacuum openings, as part of vacuum channels. A plurality, in particular at least two recesses 3, which are preferably arranged at the same distance from the respective edge is of the substrate holder 1, are incorporated in the substrate holder plate. The recesses 3 are preferably continuous holes, which are embodied in a circular manner in this embodiment. The recesses 3, however, can have any shape, in particular a rectangular shape. Recesses 3 with a complicated milled geometry are also possible.

FIG. 4b shows a schematic upper view of a second substrate holder 1' according to the invention comprising a substrate holder plate, on which, in particular a plurality of fixing elements 2' are present to fix a substrate 4 (only illustrated partially). The fixing elements 2' are preferably vacuum fixations, in particular vacuum openings, as part of vacuum channels. A plurality, in particular at least two recesses 3', are incorporated in the substrate holder plate. The recesses 3' are preferably elongated recesses 3', which are embodied by an edge 1s' of the substrate holder 1' and which lead into the interior and which were in particular created by means of a milling process. Due to the embodiment of the recesses 3' according to the invention, it is advantageously not necessary to lift the substrate holder 1' over the lower lenses 7ul, 7ur.

The mentioned substrate holders 1', 1' can be used on the lower side and/or upper side of a system according to the invention.

FIG. 5a shows a flow chart of the first method according to the invention. The process steps 100 to 103 are only performed once, while the process steps 104 to 106 can be performed a total of n-times. For the sake of clarity, the process step 107 was illustrated in a separate FIG. 21i and is equivalent to the process step 104, with the difference that a third substrate 4o' is already bonded here on a substrate stack 9, which has already been created.

FIG. 5b shows a flow chart of the second method according to the invention. The process steps 200 to 203 are only performed once, while the process steps 204 to 206 can be performed a total of n-times. For the sake of clarity, the process step 2107 was illustrated in a separate FIG. 3h and is equivalent to the process step 204, with the difference that a third substrate 4o' is already bonded here on a substrate stack 9''', which has already been created.

Figure 6A:
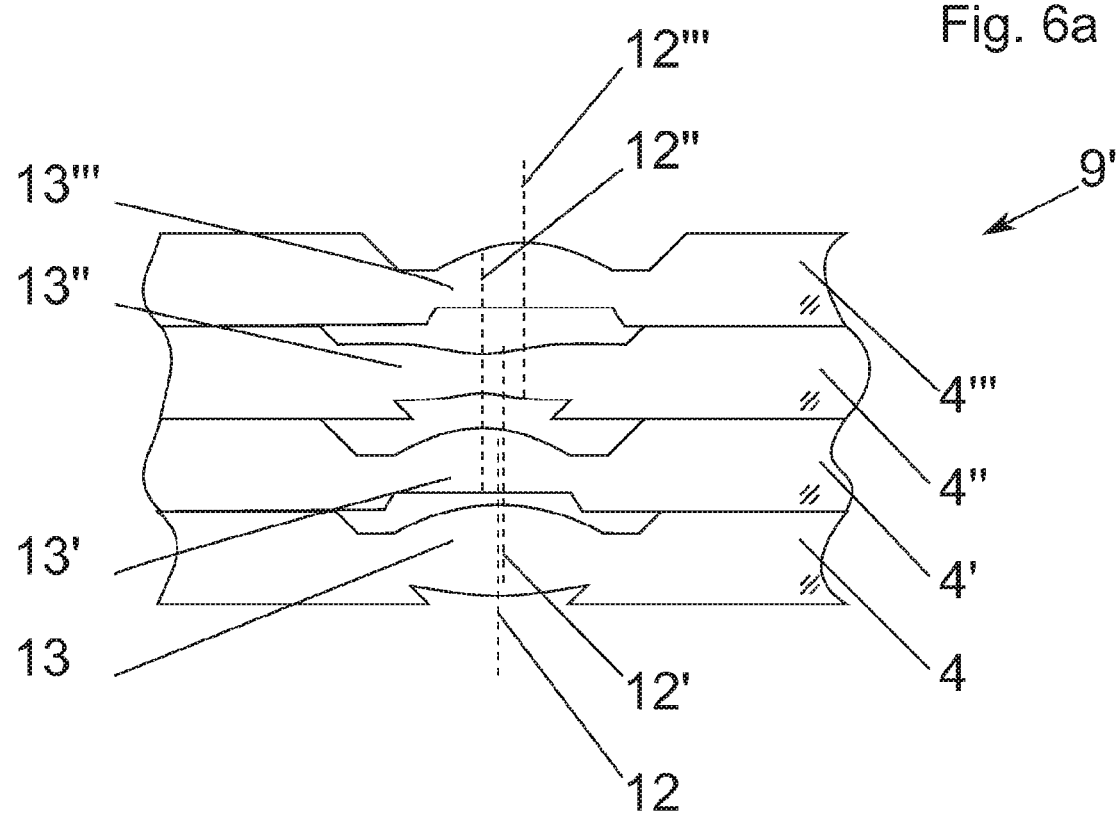
FIG. 6a shows a substrate stack produced by means of a method according to the prior art.

FIG. 6a shows the prior art, namely a partial section of a substrate stack 9', comprising four substrates 4, 4', 4'', 4''', which contain an increasing number of alignment errors and which are stacked on top of one another. In an exemplary manner, the substrates 4, 4', 4'', 4''' are monolithic lens wafers. Optical axes 12, 12' 12'', 12''' of optical elements 13, 13', 13'', 13''', in particular lenses, are not collinear. It can in particular be seen that the distance between two optical axes of two consecutive optical elements 13, 13', 13'', 13''' increases.

Figure 6B:
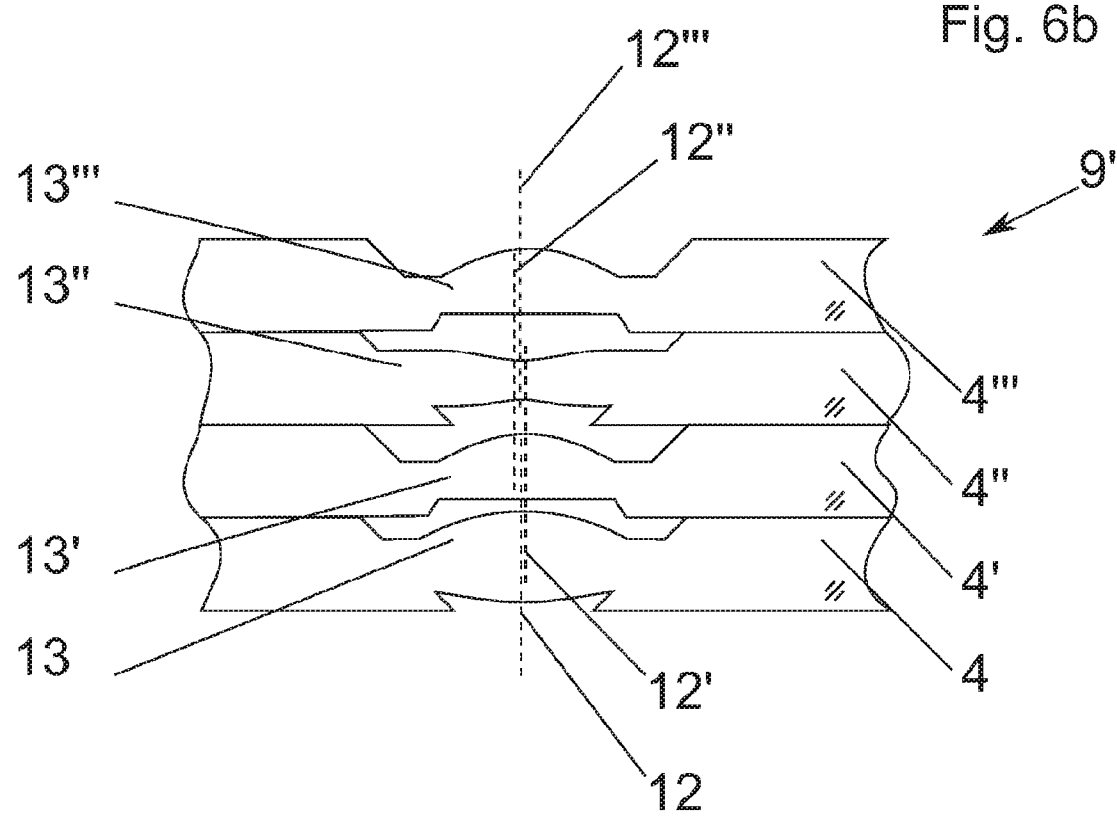
FIG. 6b shows a substrate stack produced by means of a method according to the invention.

FIG. 6b shows a partial section of a substrate stack 9', produced by means of the method according to the invention, comprising four substrates 4, 4', 4'', 4''', which contain a consistent amount of alignment errors and which are stacked on top of one another. In an exemplary manner, the substrates 4, 4', 4'', 4''' are monolithic lens wafers. The optical axes 12 of the optical elements 13, 13', 13'', 13''', in particular lenses, are not collinear. It can be seen, however, that the distance between the optical axes of the n-th substrate 4', 4'', 4''' and the first substrate 4 is approximately identical, because according to the invention, the n-th substrate 4', 4'', 4''' is aligned to the first substrate 4. An optimal state would be a stacking and alignment of the substrates 4, 4', 4'', 4''' in such a way that the optical axes 12, 12', 12'', 12''' of all optical elements 13, 13', 13'', 13''' are collinear.

LIST OF REFERENCE NUMERALS 1, 1', 1u, 1o substrate holder
1s, 1s' edge
2, 2' fixations
3, 3' recesses
4o, 4o', 4u, 4, 4', 4'', 4''' substrate.
5ul, 5ur, 5ol, 5or, 5ul', 5ur' alignment marks
6ul, 6ur, 6ol, , 6or, field of view
7ul, 7ur, 7or lens
8l, 8r detection unit
9, 9', 9'', 9''' substrate stack
10ul, 10ol, 10ur, 10or optical axes
12, 12', 12'', 12''' optical axis
13, 13', 13'', 13''' optical element
t depth of field

What is claimed is:

1. A method for bonding at least three substrates to form a substrate stack, wherein the substrate stack has at least one lowermost substrate, a middle substrate, and an upper substrate, said method comprising:
    arranging and fixing the lowermost substrate to a moveable lower substrate holder;
    detecting alignment marks on the lowermost substrate in fields of view of lower lenses;
    arranging and fixing the middle substrate on an upper substrate holder;
    detecting alignment marks on the middle substrate by use of upper lenses;
    aligning the middle substrate to the lowermost substrate;
    bonding the middle substrate to the lowermost substrate such that the bonded middle and lowermost substrates remain on the lower substrate holder;
    arranging and fixing the upper substrate on the upper substrate holder;
    detecting alignment marks on the upper substrate by use of the upper lenses;
    aligning the upper substrate to the lowermost substrate;
    bonding the upper substrate to the middle substrate to produce the substrate stack,
    wherein, during the arranging and fixing of the middle substrate on the upper substrate holder, the lower substrate holder is moved such that the lower lenses are arranged inside recesses in the lower substrate holder.

2. The method according to claim 1, wherein each of the at least three substrates has a plurality of optical lenses.

3. The method according claim 1, wherein the upper substrate is aligned to alignment marks of the lowermost substrate.

4. The method according to claim 1, wherein each subsequent substrate is aligned to the lowermost substrate.

5. The method according to claim 2, wherein optical axes of the plurality of optical lenses, which are arranged on top of one another, are aligned congruently.

6. The method according to claim 1, wherein at least four substrates are bonded to one another.

7. The method according to claim 1, wherein the alignment marks on the lowermost substrate are detected by the lower lenses, which are arranged below the lowermost substrate, through the recesses in the lower substrate holder.

8. The method according to claim 7, wherein the recesses are embodied as continuous holes in the lower substrate holder.

9. The method according to claim 7, wherein the recesses are embodied as elongated holes in the lower substrate holder.

10. The method according to claim 1, wherein the lower substrate holder is moved in the Z direction by use of a Z-positioning unit such that a deviation in an X and Y direction is minimized.

11. The method according to claim 1, wherein a readjusting unit corrects a deviation of the lower substrate holder in the X and/or Y direction in response to a movement in the Z direction.

12. The method according to claim 1, wherein the upper substrate holder has recesses,
    wherein the recesses of the upper and lower substrate holders are configured to respectively accommodate the upper and lower lenses, and
    wherein the upper and lower substrate holders have fixing elements for fixing the substrates.

13. The method according to claim 12, wherein the fixing elements include vacuum openings.

* * * * *